(12) United States Patent
Henstra et al.

(10) Patent No.: US 6,184,975 B1
(45) Date of Patent: Feb. 6, 2001

(54) ELECTROSTATIC DEVICE FOR CORRECTING CHROMATIC ABERRATION IN A PARTICLE-OPTICAL APPARATUS

(75) Inventors: Alexander Henstra; Marcellinus P. C. M. Krijn, both of Eindhoven (NL)

(73) Assignee: Philips Electron Optics B.V., Eindhoven (NL)

( * ) Notice: Under 35 U.S.C. 154(b), the term of this patent shall be extended for 0 days.

(21) Appl. No.: 09/195,887

(22) Filed: Nov. 19, 1998

(30) Foreign Application Priority Data

Nov. 20, 1997 (EP) .................................................. 97203622

(51) Int. Cl.[7] .................................................. G01J 1/00
(52) U.S. Cl. ........................................ 356/123; 250/396 R
(58) Field of Search ........................ 356/123; 250/492.28, 250/396 ML, 398, 492.23, 492.2, 396 R

(56) References Cited

U.S. PATENT DOCUMENTS 5,838,011 * 11/1998 Krijn et al. ...................... 250/396 R

OTHER PUBLICATIONS

"A Possible Chromatic Correction System for Electron Lenses," by G.D. Archard, Proc. Phys. Soc. London, 1995, pp. 817–829.

"Sphärische und chromatische Korrektur von Elektronen–Linsen," by Von O. Scherzer, pp. 114–132.

* cited by examiner

Primary Examiner—Frank G. Font
Assistant Examiner—Tu T. Nguyen
(74) Attorney, Agent, or Firm—Fulbright & Jaworski LLP

(57) ABSTRACT

Electron-optical rotationally symmetrical lenses inevitably suffer from chromatic aberration which often determines the resolution limit at low acceleration voltages. This lens defect cannot be eliminated by compensation by means of rotationally symmetrical fields. In order to improve the resolution nevertheless, it has already been proposed to correct the chromatic aberration by means of a corrector (28) provided with two correction elements (34, 40). Each correction element consists of a number of quadrupole fields. Using the known corrector, it has been found that the chromatic magnification error is inadmissibly high. In order to solve this problem, the correction elements in the corrector according to the invention are provided with at least five layers of electrodes (60-$a$, 60-$b$, 60-$c$, 60-$d$) which produce quadrupole fields. Because of the strong periodicity of the electron paths in the correcting quadrupole fields, the chromatic magnification error is limited sufficiently (or even reduced to zero) so as to allow the use of the corrector for practical purposes.

3 Claims, 7 Drawing Sheets

ELECTROSTATIC DEVICE FOR CORRECTING CHROMATIC ABERRATION IN A PARTICLE-OPTICAL APPARATUS

I FIELD OF THE INVENTION

The invention relates to a particle-optical apparatus which includes:

a particle source for emitting a beam of electrically charged particles which travel along an optical axis of the apparatus in order to expose an object, to be irradiated in the apparatus, by means of the particle beam, a focusing lens for focusing the beam of electrically charged particles, and a correction device for correcting the chromatic aberration of the focusing lens, which correction device includes correction elements, each of which is provided with electrodes for producing electric quadrupole fields, said electrodes being arranged in successive layers along the optical axis, the quadrupole fields produced by the electrodes in the layers being rotated through an angle of substantially 90° about the optical axis relative to the quadrupole field produced by the electrodes in an adjacent layer.

The invention also relates to a correction device for use in such an apparatus, and to a method of operating a correction device for correcting the chromatic aberration of a focusing lens of a particle-optical apparatus.

A correction system for correcting lens defects in particle-optical apparatus is described in an article entitled "A Possible Chromatic Correction System for Electronic Lenses" by G. D. Archard, Proc. Phys. Soc. London, 1955, pp. 817–829, notably in the sections 6 and 7 and FIG. 2b.

II GENERAL STATE OF THE ART

Particle-optical apparatus, such as electron microscopes or electron lithography apparatus, generally are arranged to irradiate an object to be studied or treated by means of a beam of electrically charged particles (usually an electron beam) which is produced by means of a particle source, such as a thermal electron source or an electron source of the field emission type. The purpose of the irradiation of the object may be to image the object to be studied (specimens in electron microscopes) or to produce very small structures on the object, for example for micro-electronics (apparatus for electron lithography). In both cases focusing lenses are required for focusing the electron beam.

The focusing of the electron beam can in principle be performed in two ways. According to a first method, the zone to be imaged of a specimen to be examined is more or less uniformly exposed by means of the electron beam and an enlarged image of the specimen is formed by means of the focusing lens. The focusing lens is in that case formed by the objective lens of an imaging lens system; the resolution of the objective lens then decides the resolution of the apparatus. Apparatus of this kind are known as Transmission Electron Microscopes (TEM). According to a second focusing method, the emissive surface of the electron source (or a part thereof) is imaged, usually in significantly reduced form, on the specimen to be examined (in the Scanning Electron Microscope or SEM) or on an object on which the relevant microstructure is to be provided (in lithography apparatus). The image of the electron source (the "spot" which is moved across the object by means of, for example deflection coils) is again formed by means of an imaging lens system. The focusing lens is then the objective lens of the spot-forming lens system; the resolution of this objective lens i then decides the spot size of the beam and hence the resolution of the apparatus.

The lenses used in all such apparatus are usually magnetic lenses, but may also be electrostatic lenses. The lenses of both types are practically always rotationally symmetrical. Such lenses inevitably have a non-ideal behavior, i.e. they inherently have lens defects which limit the resolution of the lens; its so-called spherical aberration and chromatic aberration are usually decisive for the resolution of the lens. These lens defects thus determine the limit of the resolution of the known electron optical apparatus. According to a theorem of particle optics, said lens defects cannot be eliminated by compensation by means of rotationally symmetrical electric or magnetic fields.

In contemporary electron optical apparatus, notably in scanning particle-optical apparatus having a spot-forming objective lens (the so-called scanning electron microscope (SEM)) there is a tendency to select a value for the acceleration voltage of the electron beam which is lower than was customary thus far, i.e. of the order of magnitude of from 0.5 kV to 5 kV instead of the previously customary voltage of the order of magnitude of 30 kV or more. This is because the charging of non-conductive specimens (for example, photoresist material for the manufacture of electronic integrated circuits) is substantially reduced at such comparatively low acceleration voltages and because a substantial improvement of the so-called topographic contrast is also achieved at these low voltages. For such low acceleration voltages, the chromatic aberration is the predominant lens defect, so the factor deciding the resolution of the particle-optical apparatus. (This can be readily understood considering the fact that the chromatic aberration is proportional to $\Delta\Phi/\Phi$, where $\Delta\Phi$ the non-variable energy spread in the electron beam and $\Phi$ is the nominal acceleration voltage; this factor, therefore, increases as $\Phi$ is reduced.)

In order to enhance the resolution of the particle-optical apparatus nevertheless, it has already been proposed to reduce said lens defects by means of a correction device (also referred to as a corrector) having a structure which is not rotationally symmetrical.

III BACKGROUND OF THE STATE OF THE ART

The approach that could be followed so as to attempt making the chromatic aberration of an imaging system equal to zero by means of optical elements which are not rotationally symmetrical has already been described in an article entitled "Sphärische und chromatische Korrektur von Elektronen-Linsen", Optik 2, pp. 114–132, by O. Scherzer, notably pp. 114–119.

The non-rotationally symmetrical optical elements described in the cited article (notably in the sections 1a, 1b and 1c) consist of cylinder lenses and quadrupole fields and monopole fields which act as correction members. The cylinder lenses form an astigmatic path for the electron beams and the correction members, consisting of a combination of quadrupole fields and monopole fields, are arranged in said astigmatic path. The chromatic aberration of the electron path in this known structure is corrected in a first plane which contains the optical axis (the so-called x-z plane), and subsequently the same is done in a second plane which extends perpendicularly thereto (the y-z plane). At the area where the electron path in the x-z plane is subject to chromatic correction, the distance between the electron beam and the optical axis in the y-z plane equals zero for electrons of nominal energy, and vice versa. Because an energy which deviates from the nominal energy occurs in the electron beam, the electron rays having this deviating energy follow a path other than the rays of nominal energy. The electron rays having this deviating energy thus traverse the correction member along a path which deviates from the nominal path; consequently, at said areas with a distance zero from the axis, the distance from the axis is not equal to zero for these rays. However, in the cited article it is assumed that for the rays of deviating energy this distance from the optical axis is so small that the deflecting effect thereof is negligibly small. (In this respect see notably section 1c of the cited article.)

III-1 The Problem Stemming from the State of the Art

Generally speaking, the configuration disclosed in the article by Scherzer cannot be simply used in a particle-optical apparatus. The configuration according to Scherzer constitutes an imaging system, whereas a particle optical apparatus such as a SEM needs a correction system which corrects only the chromatic aberration and has no or hardly any effect on the strength of the imaging lens (the objective). It would be feasible to replace the system known from the cited article by a system with rays which arrive in parallel and emerge in parallel, so that the latter system can be succeeded by the objective and the chromatic aberration of the system can compensate that of the objective. The described assumption that for the rays of deviating energy the distance from the optical axis is so small that the deflecting effect is negligibly small, however, appears to be invalid in the practical circumstances of contemporary particle-optical apparatus, as will be described in detail hereinafter in the sections III-2-a and III-2-b.

Notably in particle-optical apparatus of the SEM type, due to the required strength of the objective lens the electrostatic fields to be used in the correction unit have such a strength that, despite a small distance from the axis, inadmissible influencing of the electron rays traveling at a small distance from the optical axis would still take place. Consequently, electrons having an energy deviating from the nominal value would leave the corrector at a location which deviates substantially from the nominal location. This effect would then introduce a further error, the so-called chromatic magnification error, which would limit the resolution of the particle-optical apparatus to substantially the same extent as the already described chromatic aberration. This is because it can be demonstrated that it holds for the radius of the dispersion circle $r_{spot}$ due to the latter chromatic error that: $r_{spot} = a(\delta\Phi)^2 C_c \alpha$, in which a is a constant, $C_c$ is the coefficient of chromatic aberration of the objective, $\delta\Phi$ is the relative deviation from the nominal energy of the electrons (so $\delta\Phi = \Delta\Phi/\Phi_0$) and $\alpha$ is the angle of aperture of the electron beam. According to computer simulations, the constant a is much larger than 100, so that hardly any gain in respect of resolution is made by trading off the first-order chromatic aberration against the latter (second-order) chromatic aberration.

In the following sections III-2-a and III-2-b it will be demonstrated that the use of the method disclosed in the cited article by Scherzer in an electron microscope leads to an unacceptably large chromatic magnification error.

III-2 The Chromatic Magnification Error Incurred While Using the Present State of the Art First an expression for the relevant optical properties of one correction element will be derived in the following sections III-2-a-1 to III-2-a-3, both for the correction strength ($K_{corr}$) in the x-z plane in which the correction element has direct vision (so lens strength $K_x$=0) and for the lens strength ($K_y$) in the y-z plane. Comparison of the two quantities $K_{corr}$ and $K_y$ will reveal the strength in the y-z plane for the desired correction of the (first-order) chromatic aberration. Subsequently, in the next section III-2-b it will be demonstrated that the use of such a correction element in a correction system leads to an unacceptably high value of the chromatic magnification error.

III-2-a Determination of the Relevant Optical Properties of One Correction Element For the following calculations use is made of the "weak corrector approach", i.e. the variation in the axis potential of the corrector is much smaller than the potential of the accelerating field, so that the perturbation theory can be used; it is also assumed that the chromatic correction takes place in the x-z plane.

The starting point is the equation (1.4) in the cited article by Scherzer, being the paraxial motion equation in the x-z plane:

$$\Phi x'' + \frac{1}{2}\Phi' x' - \left(\Phi_2 - \frac{1}{4}\Phi''\right)x = 0 \quad (1)$$

The various symbols in the expression (1) have the following meaning:

$\Phi$ is the rotationally symmetrical term (the "zero-order" term) in the series development of the potential on the optical axis; because x and y are both 0 on the optical axis, this term of the axis potential is dependent, only on z;

$\Phi'$ and $\Phi''$ are the first and the second derivative to z, respectively, of the zero-order term of the potential on the optical axis (consequently, these derivatives are also dependent exclusively on z);

$\Phi_2$ is the quadrupole term (the second-order term) in the series development of the potential on the optical axis; it also depends exclusively on z.

Using the generally known transformation to the reduced co-ordinate $X=x\Phi^{1/4}$ (so $x=X\Phi^{-1/4}$), in which X is the so-called "Picht variable", a simplified version of the paraxial motion equation (1) is obtained:

$$X'' + TX = 0 \quad (2)$$

The variable T in the expression (2) is a function of $\Phi$, $\Phi'$ and $\Phi_2$ in conformity with:

$$T = \frac{3}{16}\frac{\Phi'^2}{\Phi'} - \frac{\Phi_2}{\Phi} \quad (3)$$

This expression (3) for T is obtained by inserting the expression for x as a function of X and its derivatives in the expression (1).

In order to reach a definition of the corrector strength of a correction element for the chromatic aberration, an analogy with a rotationally symmetrical lens is considered. For a rotationally symmetrical lens the coefficient of chromatic aberration $C_c$ is defined in generally known manner in conformity with the equation:

$$\Delta(x') = \frac{C_c}{f} \cdot \frac{\Delta\Phi}{\Phi_{0n}} \cdot \frac{x}{f} \quad (4)$$

in which the symbols have the following meaning:

x is the distance from the optical axis for an electron which travels parallel to said optical axis and is incident on the lens;

$\Delta(x')$ is the deviation, caused by the chromatic aberration, of the angle between the electron path and the optical axis after diffraction by the lens; therein, $x'(=dx/dz)$, where z is the location co-ordinate in the direction of the optical axis) is the angle between the electron path and the optical axis;

$\Delta\Phi/\Phi_{0n}$ is the deviation $\Delta\Phi$ (expressed in an equivalent voltage measure) of the energy of an electron relative to the nominal energy $\Phi_{0n}$. $\Phi_0$ is generally the potential with which the electrons enter the corrector; this quantity, therefore, still contains the thermal energy spread $\Delta\Phi$. Therefore, for an electron which does not have the nominal energy it holds that $\Phi_0 = \Phi_{0n} + \Delta\Phi$.

f is the focal distance of the lens (also expressed as 1/K, being the reciprocal strength of the lens).

Analogous to the foregoing definition, the corrector strength $K_{corr}$ of a correction element for the chromatic aberration is defined as:

$$\Delta X'(1) = -K_{corr} \cdot \frac{\Delta\Phi}{\Phi_{0n}} \cdot X(1) \quad (5)$$

or $$K_{corr} = -\frac{\Phi_{0n}}{X(1)} \frac{\Delta X'(1)}{\Delta\Phi} \quad (6)$$

The symbols in the expressions (5) and (6) which have not yet been described have the following meaning:

X is the distance from the optical axis for an electron in the correction element; X(1) is the X value at the area z=1, i.e. at the exit of the correction element. It is assumed that the electron enters and leaves the correction element parallel to the optical axis, so $X'(-1)=X'(1)=0$;

$\Delta X'(1)$ is the deviation of the angle between the electron path and the optical axis for the correction of the chromatic aberration of the lens to be corrected; therein, $X'(=dX/dz)$ is the angle between the electron path and the optical axis.

In order to find an expression for the strength of the correction element in the x-z plane, therefore, the deviation of the angle between the electron path and the optical axis $\Delta X'(1)$ must be determined. To this end, first the function T (see expression (3)) is explicitly determined, after which, using this explicit expression for T, the quantity $\Delta X'(1)$ is determined by solution of the differential equation given by the expression (2).

The perturbation theory is applied so as to execute the above calculations; use can then be made of a series development in which T and X' are not developed further than the second order.

III-2-a-1 Determination of the Function T

The determination of the function T is based on the expression (3). It is assumed that the variation of the potential $\Phi$ in the correction element is small relative to the energy (expressed in an equivalent potential measure) $\Phi_0$ with which the electrons enter the correction element. For the overall potential $\Phi$ of an arbitrary electron in a correction element, the following can then be written: $\Phi = \Phi_0 + \epsilon g$, in which g is a function of z which represents the potential variation in the correction element, and the quantity $\epsilon$ is an order parameter whose exponent represents the order of the series development. The quantity $\Phi_0$ is constant, so not a function of z.

The calculation holds for all electrons, so for electrons of nominal potential $\Phi_{0n}$ as well as for electrons which deviate therefrom by an arbitrary amount $\Delta\Phi$, so electrons having the potential $\Phi_{0n} + \Delta\Phi$.

For the function g=g(z) it holds at the entrance (z=-1) and at the exit (z=1) of the correction element that: $g(-1)=g'(-1)=g(1)=g'(1)=0$. Using said choice for $\Phi$, it also follows that $\Phi'=\epsilon g'$.

The choice of $\Phi_2$ is based on the expression (2.6) in the cited article by Scherzer (see page 117). In this expression $\Phi = \Phi_{0n} + \epsilon g$ (the axis potential of an electron of nominal energy), $\Phi'=\epsilon g'$ and $\Phi''=\epsilon g''$ are inserted and developed up to and including the second order. Execution of these operations yields for $\Phi_2$:

$$\Phi_2 = \frac{1}{2}\epsilon g'' - \frac{1}{16}\frac{\epsilon^2 g'^2}{\Phi_{0n}} \quad (7)$$

This expression (7) is now generalized by substituting a non-specified function h=h(z) for $-(1/16)g'^2$. The expression (7) thus becomes:

$$\Phi_2 = \frac{1}{2}\epsilon g'' + \frac{\epsilon^2 h}{\Phi_{0n}} \quad (8)$$

(This generalization is performed because it would be very difficult in practice to manufacture an apparatus exhibiting the desired potential variation according to the term $\Phi'^2/\Phi$ from the Scherzer formule (2.6). It follows from the calculation, and it has been demonstrated by means of computer simulation, that the real appearance of this function h does not essentially influence the ultimate correction effect, so that this generalization is justified and hence said term need not be realized exactly.)

The expression (8) as well as the previously mentioned expression $\Phi = \Phi_0 + \epsilon g$ and its derivatives $\Phi'=\epsilon g'$ and $\Phi''=\epsilon g''$ are then inserted in the expression (3) for the function T, after which this function is developed up to and including the second power of $\epsilon$. This yields the following expression for the function T:

$$T = \epsilon\left(-\frac{g''}{2\Phi_0}\right) + \epsilon^2\left(\frac{3}{16}\frac{g'^2}{\Phi_0^2} + \frac{gg''}{2\Phi_0^2} - \frac{h}{\Phi_0\Phi_{0n}}\right) \quad (9)$$

This expression (9) consists of a first-order term $T_1$ (so proportional to $\epsilon g$) and a second-order term $T_2$ (so proportional to $\epsilon^2$). Therefore, if $T=T_1+T_2$ is written, it holds that:

$$T_1 = \epsilon\left(-\frac{g''}{2\Phi_0}\right) \quad \text{and} \quad (10)$$

$$T_2 = \epsilon^2\left(\frac{3}{16}\frac{g'^2}{\Phi_0^2} + \frac{gg''}{2\Phi_0^2} - \frac{h}{\Phi_0\Phi_{0n}}\right) \quad (11)$$

III-2-a-2 Determination of the Deviation of the Exit Angle $\Delta X'(1)$

In order to determine the exit angle $\Delta X'(1)$, hereinafter first the function h will be determined in such a manner that the correction element has direct vision (as already indicated in section III-2); this will result in the expression (18). Subsequently, the strength of the correction element is determined as a function of the potential at the axis $\Phi(z)$; this will yield the expression (20).

The path equation X is now written as the sum of three terms, i.e. a zero-order term which is equal to 1, a first-order term $X_1$ and a second-order term $X_2$, so $X=1+X_1+X_2$. (It also follows therefrom that $X'=X_1'+X_2'$ and $X''=X_1''+X_2''$.) The differential equation for X as given by the expression (2) assumes the following appearance after insertion of the above expressions $X=1+X_1+X_2$ and $X''=X_1''+X_2''$ and the previously mentioned expression $T=T_1+T_2$:

$$X_1''+X_2''+(T_1+T_2)(1+X_1+X_2)=0 \quad (12)$$

which, after splitting into the first-order part and the second-order part and insertion of expression (10) for $T_1$, yields for $X_1$:

$$X_1 = \frac{\varepsilon g}{2\Phi_0} \quad (13)$$

As the second-order part of the expression (12) it follows for $X_2$ that:

$$X_2''+T_1 X_1+T_2=0 \quad (14)$$

insertion of the expressions (10) for $T_1$, (11) for $T_2$ and (13) for $X_1$, then yields:

$$X_2'' = \frac{\varepsilon^2}{\Phi_0^2}\left(-\frac{3}{16}g'^2 - \frac{1}{4}gg'' + \frac{\Phi_0}{\Phi_{0n}}h\right) \quad (15)$$

It is to be noted that it appears from the expression (15) that $X_2''$ is proportional to $\varepsilon^2$, as could be expected because $X_2$ represents the second-order part of the path equation. The above differential equation for $X_2$ can then be integrated once over the interval between $z=-1$ and $z=1$, yielding:

$$X_2'(1) - X_2'(-1) = \frac{\varepsilon^2}{\Phi_0^2} \int_{-1}^{1}\left(\frac{1}{16}g'^2 + \frac{\Phi_0}{\Phi_{0n}}h\right)dz \quad (16)$$

for which use is made of $$\int_{-1}^{1} g'' dz = -\int_{-1}^{1} g'^2 dz \quad (17)$$

which expression (17) follows from partial integration with secondary conditions $g(-1)=g'(-1)=g(1)=g'(1)=0$. $X_2'(-1)$ in the expression (17) equals zero, because it holds that $X'(-1)=X_1'(-1)+X_2'(-1)$, where $X'(-1)$ equals zero because of the secondary condition $g'(-1)=0$ in combination with the expression (13), and where $X_1'(-1)$ equals zero because of the secondary condition $g'(-1)=0$ in combination with the expression (13).

The form $\int h dz$ can also be expressed in $-\int g'^2 dz$. To this end, use is made of the requirement that the correction unit must have direct vision for the nominal energy, so $X'(1)=0$ for $\Delta\Phi=0$ or $\Phi_0=\Phi_{0n}$. Because it holds that $X'(1)=X_1'(1)+X_2'(1)$ and $X_1'(1)=0$ on the basis of the expression (13) in combination with the secondary condition $g'(1)=0$, it thus holds that $X_2'(1)=0$ for $\Phi_0=\Phi_{0n}$. This means that the left term of the expression (16) must be equal to zero, so that the relation between $\int h dz$ and $-\int g'^2 dz$ follows from:

$$\int_{-1}^{1} h dz = -\frac{1}{16}\int_{-1}^{1} g'^2 dz \quad (18)$$

The above integral expression (18) can be substituted for h in the expression (16), whereas $\Phi_0=\Phi_{0n}+\Delta\Phi$ can be written for an electron of non-nominal potential, and for $X_2'(1)-X_2'(-1)=\Delta X_2'(1)$; $\Phi'=\varepsilon g'$ is also inserted (see section III-2-a-1). This yields:

$$\Delta X_2'(1) = -\frac{\Delta\Phi}{16\Phi_0^2 \Phi_{0n}} \int_{-1}^{1} \Phi'^2 dz \quad (19)$$

The strength of the correction element is given by the expression (6) in which the quantity $\Delta X_2'(1)$ in the numerator is given by the expression (19). As regards the denominator $X(1)$ of the expression (6) it is to be noted that it is of the second order, because $X(1)=1+X_1(1)+X_2(1)$, where $X_1(1)=0$ (because $g(1)=0$ in combination with the expression (13)) and where $X_2(1)$ is of the second order, so that $X(1)$ is of the second order. Because the numerator of the expression (6) is of the second order (see expression (16) in which $\varepsilon^2$ occurs), $X(1)$ in the denominator of the expression (6) can be made equal to 1. In these circumstances, insertion of the expression (19) in the expression (6) yields the ultimate expression concerning the strength $K_{corr}$ of the correction element in the x-z plane:

$$K_{corr} = \frac{1}{16\Phi_0^2} \int_{-1}^{1} \Phi'^2 dz \quad (20)$$

III-2-a-3 Determination of the Strength of the Correction Element in the y-z Plane The calculation described in this section will hold for an electron of nominal potential $\Phi_{0n}$. On the basis of the equation (1.4) in the cited article by Scherzer, being the paraxial motion equation in the y-z plane, in the y-z plane the known transformation to the reduced co-ordinate Y is performed, analogous to the x-z plane: $Y=y\Phi^{1/4}$, yielding the paraxial motion equation in the y-z plane $Y''+TY=0$. (Compare expression (2) for the x-z plane.) The function T now applicable is then:

$$T = \frac{3}{16}\frac{\Phi'^2}{\Phi^2} + \frac{\Phi_2}{\Phi} \quad (21)$$

It is to be noted that the expression for the function T for the y-z plane is the same, except for the sign of $\Phi_2/\Phi$, as that for the function T for the x-z plane.

The strength $K_y$ of the correction element in the y-z plane is defined as $$K_Y = -\frac{Y'(1)}{Y(1)} \quad (22)$$

$Y=1+Y_1+Y_2$ can be defined analogously to the calculation for the x-z plane. The first-order term $Y_1$ at the area 1 (so $Y_1(1)$) is zero, so that $Y(1)=1+Y_2(1)$, in which $Y_2(1)$ is of the second order, so that the denominator $Y(1)$ of the expression (26) is of the second order. The numerator $Y'(1)$ again is of the second order for the y-z plane, so that terms of an order higher than zero in the numerator may be ignored and the numerator may be assumed to be 1. Thus, for the strength $K_y$ of the correction element in the y-z plane remains: $K_y \approx -Y'$ (1), so that in conformity with the above relation Y(1)=1+Y$_2$(1) it holds that: K$_y$=−Y$_2$'(1).

The expression yet to be determined for Y$_2$'(1) has the same structure as the expression for X$_2$'(1) (which follows from the equation (16); however, because of the opposite sign in the function T, a number of coefficients in the derivation of the expression for Y$_2$'(1) have received a different value. After a calculation which is performed in the same way as that for the x-z plane, ultimately the following expression is obtained for Y$_2$":

$$Y_2'' = \frac{\varepsilon^2}{\Phi_0^2}\left(-\frac{3}{16}g'^2 + \frac{3}{4}gg'' - h\right) \quad (23)$$

which expression is analogous to the expression (15) which holds for the x-z plane. Using a calculation which is analogous to that used for the x-z plane, finally the following expression follows for Y$_2$'(1) from the expression (23):

$$Y_2'(1) = -\frac{\varepsilon^2}{\Phi_0^2}\int_{-1}^{1}\frac{14}{16}g'^2\,dz \quad (24)$$

which expression is analogous to an expression for the x-z plane which occurs when the expression (15) is integrated once and an integral expression (18) for h is included therein.

Finally, when $\varepsilon g'=\Phi'$ is inserted in the expression (24), the ultimate expression for the strength K$_y$ of the correction element in the x-z plane is obtained:

$$K_y = \frac{14}{16\Phi_0^2}\int_{-1}^{1}\Phi'^2\,dz \quad (25)$$

which, while using the expression (20), yields for the value of K$_y$:

$$K_y = 14 K_{corr} \quad (26)$$

The important conclusion can be drawn from the expression (26) that in the case of one direct vision correction element, the lens strength in the y-z plane is many times greater than the corrector strength in the x-z plane; the value of this factor, therefore, is of the order of magnitude of 14. Using computer simulation with a typical configuration and also using the exact electron paths, it appears that this factor is approximately 20, so that the previously described approaches in any case yield the correct order of magnitude for this factor.

It is to be noted that the quantity K$_y$ indicates a lens strength, so a quantity whose reciprocal value represents a focal distance, and that the quantity K$_{corr}$ indicates a corrector strength, so a quantity which indicates to what extent an electron of deviating energy exhibits an angular deviation relative to the optical axis upon leaving the correction element. Therefore, the latter quantity is not a lens strength.

III-2-b Use of a Correction Element in a Correction System

It will be demonstrated hereinafter that the chromatic magnification error assumes an inadmissibly high value because K$_y$≈14K$_{corr}$. To this end, it is assumed that the single correction element described above forms part of a known system for the correction of chromatic aberration as described in said article by Archard. The correction system described therein consists of a combination of two quadrupole lenses, each having a strength K$_Q$, and some correction sub-systems, each sub-system consisting of a single correction element as described above which is arranged between two quadrupole lenses having a strength K$_Q$/2 each. The overall correction system thus consists of a succession of a first quadrupole lens, a first and a second sub-system, and a second quadrupole lens. For the calculation it is assumed that all quadrupole lenses and the single correction element in the correction system are formed as thin elements, that each quadrupole lens has a chromatic aberration coefficient C$_{c,Q}$ amounting to the reciprocal strength (i.e. 1/K$_Q$ or 2/K$_Q$), that for the distance d between the first quadrupole lens and the first correction sub-system it holds that d=1/K$_Q$, which also holds for the distance d between the second correction sub-system, and that for the distance 2d between the two correction sub-systems it holds that 2d=2/K$_Q$. Only the chromatic magnification error in the x-z plane at the exit of the overall correction system will be calculated, because the chromatic magnification error in the y-z plane is much smaller.

In the case of a thin quadrupole of strength K$_Q$, the relationship between x$_o$ and x$_o$' (the distance between the outgoing ray in the x-z plane and the optical axis or the slope of this ray) on the one side and x$_i$ and x$_i$' (the distance between the incident ray in the x-z plane and the axis or the slope of this ray) on the other hand it holds that:

$$\begin{pmatrix} x_o \\ x_0' \end{pmatrix} = \begin{pmatrix} 1 & 0 \\ K_Q(1-\delta\Phi) & 1 \end{pmatrix}\begin{pmatrix} x_i \\ x_i' \end{pmatrix} \quad (27)$$

in which δΦ is the relative deviation with respect to the nominal value Φ$_0$ of the acceleration voltage, so δΦ=ΔΦ/Φ$_0$.

Analogously, the following holds for the relationship between the relevant quantities in the y-z plane:

$$\begin{pmatrix} y_o \\ y_0' \end{pmatrix} = \begin{pmatrix} 1 & 0 \\ -K_Q(1-\delta\Phi) & 1 \end{pmatrix}\begin{pmatrix} y_i \\ y_i' \end{pmatrix} \quad (28)$$

Finally, for a displacement of the ray over a distance z without diffraction of the ray it holds analogously that:

$$\begin{pmatrix} x_o \\ x_0' \end{pmatrix} = \begin{pmatrix} 1 & d \\ 0 & 1 \end{pmatrix}\begin{pmatrix} x_i \\ x_i' \end{pmatrix} \quad (29)$$

while, evidently, a corresponding relation holds for the corresponding quantities in the y-z plane.

Furthermore, in the x-z plane it holds for the single correction element as described above that:

$$\begin{pmatrix} x_o \\ x_0' \end{pmatrix} = \begin{pmatrix} 1 & 0 \\ -\delta\Phi\cdot K_{corr} & 1 \end{pmatrix}\begin{pmatrix} x_i \\ x_i' \end{pmatrix} \quad (30)$$

whereas for the relationship between the relevant quantities in the y-z plane it holds that:

$$\begin{pmatrix} y_o \\ y_0' \end{pmatrix} = \begin{pmatrix} 1 & 0 \\ -K_y & 1 \end{pmatrix}\begin{pmatrix} y_i \\ y_i' \end{pmatrix} \quad (31)$$

In the expressions (30) and (31) the quantity δΦ has been omitted in the matrix elements which do not contribute to the ultimate expression for x$_o$ and in which δΦ would occur. This is justified because the present calculation only aims to give an impression of the order of magnitude of the chromatic magnification error and said matrix elements would make only a (negligibly small) contribution of higher order in $\delta\Phi$ to the ultimate value of $x_o$. Such ignoring will also take place hereinafter for the elaboration of the matrices.

Using the above expressions (27) and (30), it now follows for a correction sub-system (i.e. a system consisting of a single correction element which is arranged between two quadrupole lenses, each having a strength $K_Q/2$) in the x-z plane that:

$$\begin{pmatrix} x_o \\ x'_0 \end{pmatrix} = \begin{pmatrix} 1 & 0 \\ -K_Q - \delta\Phi \cdot K_{corr} & 1 \end{pmatrix} \begin{pmatrix} x_i \\ x'_i \end{pmatrix} \quad (32)$$

and, using the expressions (28) and (31), for the y-z plane that:

$$\begin{pmatrix} y_o \\ y'_0 \end{pmatrix} = \begin{pmatrix} 1 & 0 \\ K_Q - K_y & 1 \end{pmatrix} \begin{pmatrix} y_i \\ y'_i \end{pmatrix} \quad (33)$$

For the derivation of the expressions (32) and (33) it has been assumed that the chromatic aberration of all quadrupoles is zero; this assumption is valid if it holds that $K_{corr} \gg K_Q$. The beam path in the x-z plane for the overall correction system is then found by combining the beam path in the first quadrupole, the first and the second sub-system, and the second quadrupole. It is again assumed that the chromatic aberration of all quadrupoles is zero. This yields:

$$\begin{pmatrix} x_o \\ x'_o \end{pmatrix} = \begin{pmatrix} 1 & 0 \\ -K_Q & 1 \end{pmatrix} \begin{pmatrix} 1 & \frac{1}{K_Q} \\ 0 & 1 \end{pmatrix} \begin{pmatrix} 1 & 0 \\ K_Q - K_y & 1 \end{pmatrix} \begin{pmatrix} 1 & \frac{2}{K_Q} \\ 0 & 1 \end{pmatrix} \quad (34)$$

$$\begin{pmatrix} 1 & 0 \\ -K_Q - \delta\Phi \cdot K_{corr} & 1 \end{pmatrix} \begin{pmatrix} 1 & \frac{1}{K_Q} \\ 0 & 1 \end{pmatrix} \begin{pmatrix} 1 & 0 \\ K_Q & 1 \end{pmatrix} \begin{pmatrix} x_i \\ 0 \end{pmatrix}$$

Elaboration of the above expression (34) for $x_o$ yields:

$$x_o = x_i \left\{ -1 + \delta\Phi \left( \frac{4K_{corr}K_y}{K_Q^2} - \frac{10K_{corr}}{K_Q} \right) \right\} \quad (35)$$

If it holds that $K_{corr} \gg K_Q$, the expression (35) can be approximated (for $K_y \approx 14K_{corr}$, as has already been demonstrated in the preceding section III-2-a-3) by:

$$x_o = x_i \left\{ -1 + \delta\Phi \left( \frac{4K_{corr}K_y}{K_Q^2} \right) \right\} \quad (36)$$

It is to be noted that the expression (36) represents a suitable approximation if $K_{corr} \gg K_Q$. If $K_{corr}$ amounts to only a few times (for example, three or more) $K_Q$, this expression (36) remains an approximation which can be used to demonstrate that the chromatic magnification error becomes inadmissibly large.

From the expression (34) it also follows for $x_o'$ that:

$$x_o' = 4 \cdot \delta\Phi \cdot K_{corr} x_o \quad (37)$$

It is to be noted that if the above approximation (i.e. that the chromatic aberration of all quadrupoles is zero) is not permissible, the expression (37) will become:

$$x_o' = 4\delta\Phi(K_{corr} - K_Q) \quad (38)$$

For suitable operation as a chromatic aberration corrector it is necessary that the ratio of the exit angle $x_o'$ and the exit height $x_o$ (so $x_o'/x_o$) is directly proportional to $\delta\Phi$; this requirement is satisfied only if the term $\delta\Phi(4K_{corr}K_y/K_Q^2)$ in the expression (36) is sufficiently small in relation to 1. In the preceding section III-2-a-3 it has already been demonstrated that $K_y \approx 14K_{corr}$, so that this term becomes $56\delta\Phi (K_{corr}/K_Q)^2$. Practical values for the quantities of the latter expression are, for example: $\Phi_0 = 500V$ and $\Delta\Phi = 0.25V$, so that $\delta\Phi = 10^{-4}$ and $K_{corr} = pK_Q$, in which p is a proportionality constant. It follows from the expression (38) that p must in any case be larger than 1. For practical reasons usually a value of the order of magnitude of from 3 to 5 will have to be chosen for p. Using these values, it follows that said term is approximately equal to 0.45, so that it is not negligibly small relative to 1. The chromatic magnification error of the overall corrector, therefore, in this known configuration will have such a high value that the correction system proposed by Archard, using the correction units proposed by Scherzer, cannot be used in practice. This is because the expression mentioned for $r_{spot}$ in section III-2 will then assume such a high value that the gain as regards resolution of the particle lens to be corrected is substantially canceled by the loss in resolution due to the chromatic magnification error.

IV OBJECT AND STEPS ACCORDING TO THE INVENTION

It is an object of the invention to provide a correction device of the kind set forth in which the described problem of a large chromatic magnification error does not occur. To this end, the particle optical apparatus according to the invention is characterized in that the correction elements (34, 40) comprise at least five layers of electrodes.

IV-1 Description of the Steps Taken According to the Invention

Using a calculation, the transfer properties of one correction element will be derived for the case involving a large number of layers of electrodes. It will be used to demonstrate that the chromatic magnification error of the complete corrector composed of such elements can be made sufficiently small. Analogous to the description given in section III-2-a-3, the starting point is the relation for the path equation $Y = 1 + Y_1 + Y_2$, in which $Y_1$ is a first-order term and $Y_2$ is a second-order term. It now also holds that $Y'' = Y_1'' + Y_2''$. The mean force acting on an electron is proportional to the mean $<Y''>$. (The notation $<Y>$ indicates the mean value of Y.) The mean value $<Y''>$ of $Y''$ can thus be written as $<Y''> = <Y_1''> + <Y_2''>$.

Analogous to expression (13), it now holds that:

$$Y_1 = -\frac{\varepsilon g}{2\Phi_0} \quad (39)$$

It is to be noted that the function g is a function of z which represents the potential variation at the optical axis in the correction element. Because the correction element is composed of a number of layers, the function g will have a continuous periodic variation, the number of periods being equal to half the number of layers so that the second derivative g'' will also be continuously periodic. The mean value of such a function over a large number of periods is substantially zero, so that $<Y_1''>$ may also be set equal to 0. Thus, $<Y''> = <Y_2''>$. The determination of $<Y_2''>$ utilizes the expression (27) from which it follows directly that:

$$\langle Y_2''\rangle = \frac{\varepsilon^2}{\Phi_0^2}\left(-\frac{3}{16}\langle g'^2\rangle + \frac{3}{4}\langle gg''\rangle - \langle h\rangle\right) \tag{40}$$

In the expression (40), like in the expression (17), use can again be made of the equality $\langle gg''\rangle = -\langle g'^2\rangle$, which equality holds exactly for an integer number of periods and holds as a suitable approximation in the case of a number of periods which is not too small; furthermore, analogous to the expression (18), use can be made of the equality $\langle h\rangle = -\frac{1}{16}\langle g'^2\rangle$. Insertion of the latter two equalities yields:

$$\langle Y_2''\rangle = \frac{\varepsilon^2}{\Phi_0^2}\left(-\frac{7}{8}\langle g'^2\rangle\right) \tag{41}$$

For $\Phi=\Phi_0+\varepsilon g$ (see section III-2-a-1), so $\Phi'=\varepsilon g'$, and for $\langle Y''\rangle = \langle Y_2''\rangle$ is follows that:

$$\langle Y''\rangle = -\frac{7}{8\Phi_0^2}\langle\Phi'^2\rangle \tag{42}$$

For the derivation of the expression (42) it has been assumed that the electrons are incident parallel to the optical axis in the correction element and at a height 1. Because the behavior of the optical elements considered is linear, for electrons incident at a height $Y_0$ it generally holds that the expression (42) must still be multiplied by $Y_0$.

On the basis of the expression (42) it can be deduced that electrons traveling parallel to the optical axis are accelerated in the direction of the optical axis.

The above expression (42) holds only for the areas of the electron path where it extends approximately parallel to the optical axis. A further calculation can be performed to demonstrate that the following differential equation holds for the electron path Y(z):

$$\langle Y\rangle'' + \frac{7}{8\Phi_0^2}\langle\Phi'^2\rangle\cdot\langle Y\rangle = 0 \tag{43}$$

As is known, the solution of a differential equation having the appearance of the expression (43) has the form of a sine function; this again demonstrates that electron paths represented by such a function are always subject to a force in the direction of the axis. The correction elements are then excited in such a manner that the course of the electron paths in the y-z plane is practically sinusoidal with an integer number of half wavelengths (so that the argument of the sine function in the exit plane is $n.\pi$). It has already been demonstrated that in the known correction element according to Archard a factor $K_y$ occurs in the transfer matrix for one correction element (see expression (31)), which factor thus occurs in the expressions (35) and (36); the occurrence of this factor in the latter expressions causes the chromatic magnification error in the relevant corrector. For a correction element according to the invention it can be demonstrated that the expression corresponding to the expression (31) becomes $$\begin{pmatrix}y_o\\y_o'\end{pmatrix} = (-1)^n\begin{pmatrix}1 & 0\\0 & 1\end{pmatrix}\begin{pmatrix}y_i\\y_i'\end{pmatrix} \tag{44}$$

The latter expression (44) follows simply from the transfer matrix T for a sinusoidal path with argument $\alpha z$:

$$T = \begin{pmatrix}\cos(\alpha z) & \frac{1}{\alpha}\sin(\alpha z)\\ -\alpha\sin(\alpha z) & \cos(\alpha z)\end{pmatrix} \tag{45}$$

in which it holds for $\alpha$ that:

$$\alpha = \sqrt{\frac{7\langle\Phi'^2\rangle}{8\Phi_0^2}} \tag{46}$$

The position of the variable $K_y$ in the expression (31) contains the value 0 in the expression (44), so that the factor of $\delta\Phi$ in the expression (35) is canceled; this means that the chromatic magnification error has thus been significantly reduced.

V BRIEF DESCRIPTION OF THE FIGURES

The invention will be described in detail hereinafter with reference to the accompanying Figures in which corresponding elements are denoted by the same reference numerals. Therein:

VI DETAILED DESCRIPTION OF SOME EMBODIMENTS OF THE INVENTION

Figure 1:
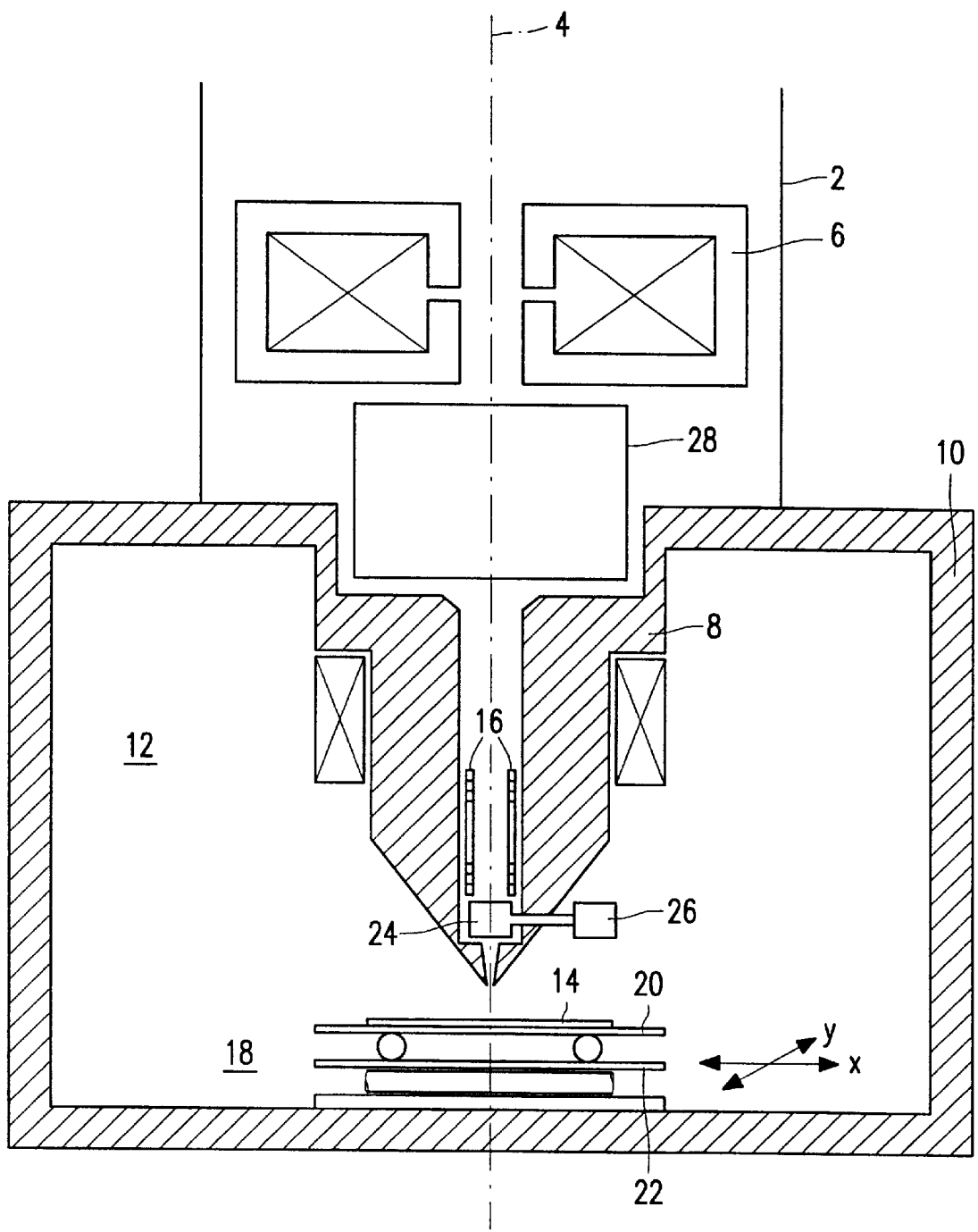
FIG. 1 is a diagrammatic representation of a relevant part of a particle optical instrument in which the correction device (corrector) according to the invention can be used.

FIG. 1 shows a particle optical instrument in the form of a part of a column 2 of a scanning electron microscope (SEM). As is usual, a beam of electrons is emitted by an electron source in this instrument (not shown in the Figure), said beam traveling along the optical axis 4 of the instrument. The electron beam can traverse one or more electromagnetic lenses, such as the condensor lens 6, after which it reaches the objective lens 8. This lens, being a so-called monopole lens, forms part of a magnetic circuit which is also formed by the wall 10 of the specimen chamber 12. The objective lens 8 is used to form an electron beam focal spot whereby the specimen 14 is scanned. Scanning takes place by moving the electron beam across the specimen in the x direction as well as the y direction by means of scan coils 16 which are provided in the objective lens 8. The specimen 14 is arranged on a specimen table 18 which includes a carrier 20 for the x displacement and a carrier 22 for the y displacement. A desired area of the specimen can be selected for examination by means of these two carriers. Imaging in this microscope is realized in that secondary electrons are released from the specimen, which electrons travel back in the direction of the objective lens 8. The secondary electrons are detected by a detector 24 which is provided in the bore of this lens. Connected to the detector is a control unit 26 for actuating the detector and for converting the flow of detected electrons into a signal which can be used for forming an image of the specimen, for example by means of a cathode ray tube (not shown). A corrector 28 for correcting the chromatic aberration of the objective lens is arranged between the condensor 6 and the objective lens as will be described hereinafter.

Figure 2:
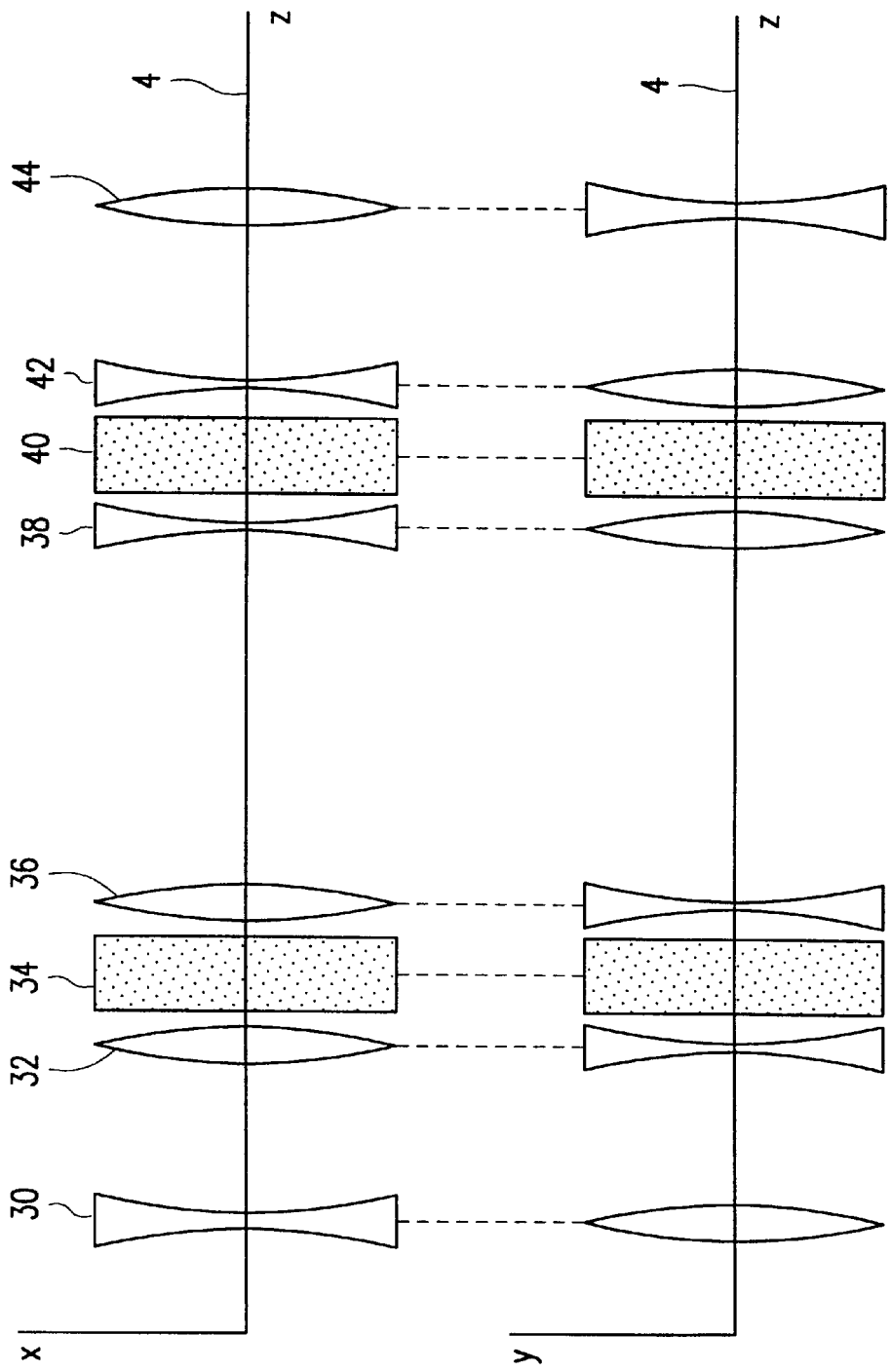
FIG. 2 is a diagrammatic representation of a corrector consisting of correction elements and quadrupoles, both for the x-z plane and for the y-z plane.

FIG. 2 shows diagrammatically the construction of a corrector consisting of correction elements and quadrupoles, both for the x-z plane and for the y-z plane. This Figure can represent a corrector as known from the state of the art as well as a corrector according to the invention, depending on the contents of the correction elements 34 and 40 included in this Figure. The complete corrector in both cases consists of a succession of a first quadrupole 30, a second quadrupole 32, a first correction element 34, a third quadrupole 36, a fourth quadrupole 38, a second correction element 40, a fifth quadrupole 42 and a sixth quadrupole 44, all elements being centered relative to the optical axis 4. The upper drawing in FIG. 2 applies to the x-z plane and the lower drawing to the y-z plane; this can also be deduced on the basis of the symbols for the quadrupoles which in one plane oppose those in the other plane.

When FIG. 2 represents a corrector as known from the cited article by Archard, the first correction element 34 has a positive diffraction effect in the y-z plane and is neutral in the x-z plane; the effect of this element can thus be considered to be that of a cylinder lens. The second correction element 40 then has a positive diffractive effect in the x-z plane and is neutral in the y-z plane; this element can thus also be considered to be a cylinder lens which thus extends perpendicularly to the former cylinder lens. The quadrupoles 32 and 36 in this known corrector are integrated in the correction element 34 and the quadrupoles 38 and 42 are integrated in the correction element 40; this does not make a significant difference in respect of the behavior of this corrector. For such a corrector the course of the electron rays therein can be determined by means of computer simulation.

Figure 3:
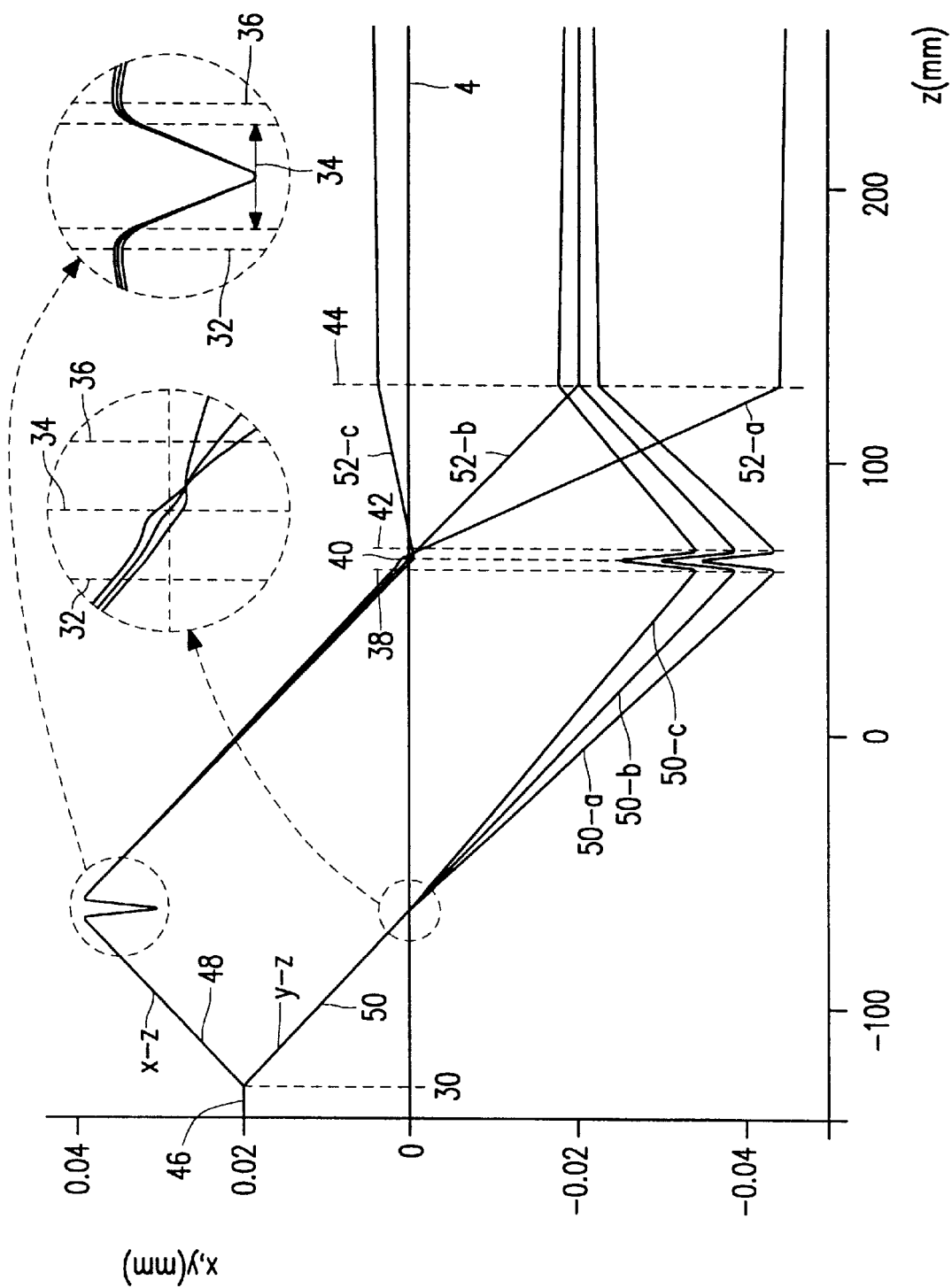
FIG. 3 shows diagrammatically the beam path in a known corrector, both for the x-z plane and for the y-z plane.

FIG. 3 shows the result of the above-mentioned computer simulation as executed by means of a commercially available simulation program. This computer program is known as "TRC/TRASYS" and is available from Delft Technical University, Department of Applied Physics, Particle Optics Group, Delft, The Netherlands. The electric fields required according to said simulation program can be entered in the form of an analytic expression, or can be calculated by means of a number of other programs which are known as "ELD, Electrostatic Lens Design" and "EMD, Electrostatic Multipole Design"; these programs are also available from the afore-mentioned Delft Technical University.

Figure 4:
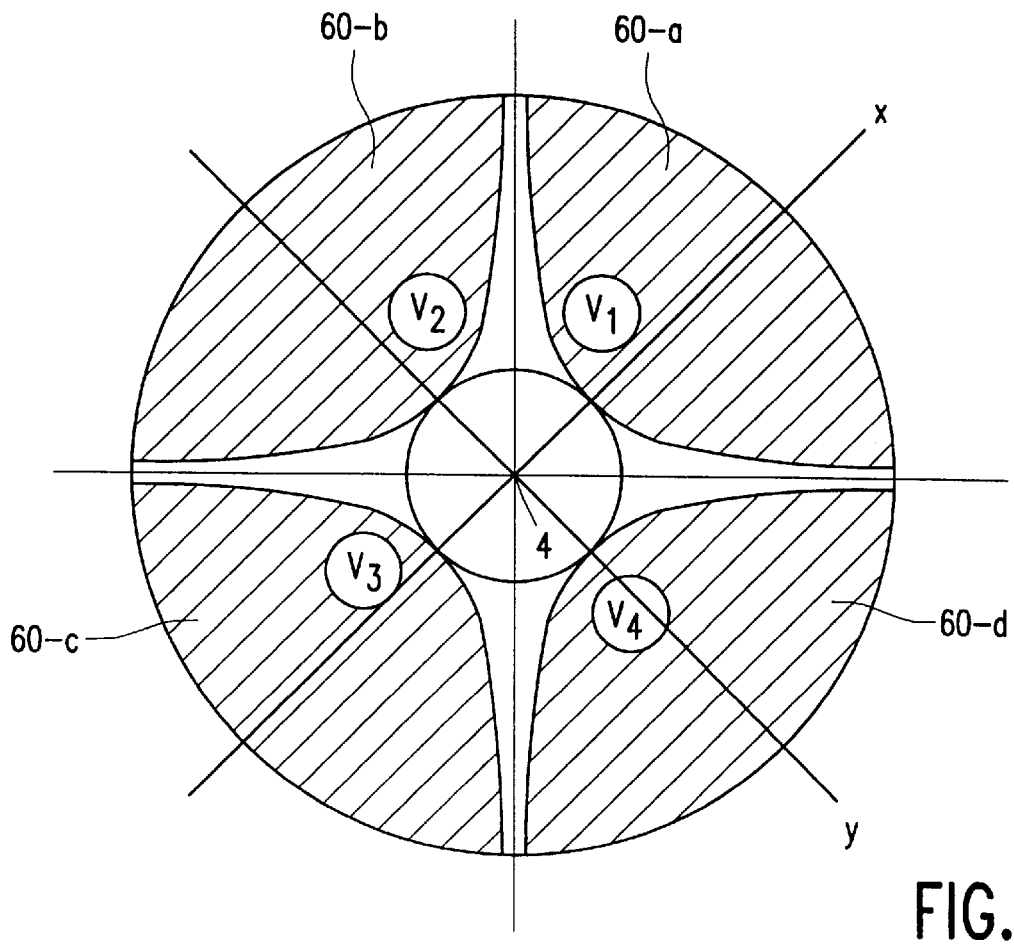
FIG. 4 shows the shape of an electrode which constitutes one layer in a correction element according to the invention.

FIG. 3 shows the course of the electron rays in the known corrector for the x-z plane as well as for the y-z plane. For the simulation of the course of these rays it is assumed that the acceleration voltage $\Phi_{0n}$=1000 V and that the electrons in the incident electron beam are distributed between three energies, i.e. the nominal voltage of 1000 V and a deviation $\Delta\Phi=\pm 2$ V. The correction elements 34 and 40 of this corrector are fully identical, but the element 40 has been rotated 90° with respect to the element 34. Each quadrupole in this corrector, so also the quadrupoles in the correction elements, is assumed to be constructed as shown in FIG. 4 with a radius of 0.75 mm of the central circle which is tangent to the hyperbolas. The two quadrupoles 30 and 44 consist of successively a tube for electric termination which has an inner diameter of 1.5 mm and is followed at a distance of 1 mm by a first quadrupole which has a thickness of 1.5 mm and is succeeded at a distance of 1 mm by a tube for electric termination which has an inner diameter of 1.5 mm. For the quadrupole 30 the voltage at the electrodes amounted to +4.34 V and −4.34 V for the x-z plane and the y-z plane, respectively; the opposite values hold for the quadrupole 44. The directly adjacent quadrupoles of the correction elements were integrated with these correction elements; this does not make a significant difference in respect of the behavior of this corrector. Each correction element consists of successively a tube which has said inner diameter and a voltage of 0 V and is succeeded at a distance of 1 mm by a first quadrupole which has a thickness of 1 mm and is succeeded at a distance of 1 mm by a second quadrupole which has a thickness of 1.5 mm and is succeeded at a distance of 1 mm by a third quadrupole which has a thickness of 1 mm and is succeeded at a distance of 1 mm by a tube which has said inner diameter and a voltage of 0 V. The voltages at the electrodes of the outer two quadrupoles of the correction element 32, 34, 36 amounted to −80.3 V for the x-z plane and to +80.3 V, respectively; the voltages for the central quadrupole amounted to −556.8 V and +556.8 V, respectively. The voltages for the corresponding quadrupoles of the correction element 38, 40, 42 had the opposite value.

The further course of a ray 46, incident parallel to the optical axis 4, is represented by a ray 48 in the x-z plane and by a ray 50 in the y-z plane. FIG. 3 also shows the location of the various optical elements of FIG. 2, together with the relevant reference numerals. For as long as no dispersion occurs, the electrons of different energies will all follow the same path.

The first quadrupole 30 and the second quadrupole 32 are excited in such a manner that the ray 50 (i.e. the ray in the y-z plane) passes through the center of the correction element 34. Because of the (slight) chromatic aberration of the first quadrupole 30, the ray 50 experiences a slight angular deviation when it emanates from this quadrupole, so that the rays for the different energies enter the correction element 34 with a slight difference in height. Because the first correction element 34 in the y-z plane is a strong lens, rays of different energy will emanate from the system 32, 34, 36 at different angles due to this height difference. This means that the electrons in the ray 50 which have the nominal energy emanate from the correction element 34, parallel to the ray 50 and practically without shift with respect thereto, as a ray 50-$b$ whereas, due to the energy difference upon passage through these elements, the ray 50 is split further into the rays 50-$a$ (with a positive energy deviation) and 50-$c$ (with a negative energy deviation). Consequently, these three rays will be incident on the quadrupole 38 at mutually different heights and at mutually different angles. Because the three rays originate substantially from a single object point (i.e. the point of intersection of the ray 50 and the optical axis 40 at the center of the correction element 34), the three rays are diffracted in the quadrupole 38 in such a manner that they enter the second correction element 40 practically parallel to one another. Because the second correction element 40 does not have a lens effect in the y-z plane, the three rays emanate from this element 40 with the same height difference. Because of their mutual energy difference, however, these rays emanate from the element 40 at different angles. The chromatic aberration correction effect of the correction element will be apparent from the occurrence of this angular difference. Subsequently, the rays are deflected in the direction of the optical axis again by the quadrupole 42; the two rays of deviating energy then retain their angular deviation relative to the central ray. The quadrupole 44 deflects the rays back again, the ray of nominal energy again being directed parallel to the optical axis; the other two rays retain their angular deviation relative to the central ray of nominal energy. The Figure shows that a comparatively small chromatic magnification error then occurs (i.e. the height difference upon departure from the quadrupole 44) which, however, would still be permissible for most practical purposes.

In the x-z plane the ray 48 is deflected away from the optical axis by the first quadrupole 30, after which it enters the system 32, 34, 36 at a comparatively great height. The quadrupole 32 deflects this ray in such a manner that it enters the correction element 34 parallel to the optical axis. For the x-z plane and an electron of nominal energy, the correction element 34 has a neutral effect, but in this element a strong angular deviation occurs for deviating energies so that the ray emanating from the quadrupole 36 is split into three rays having an angular deviation relative to one another. Over the distance from the system 32, 34, 36 to the system 38, 40, 42 this angular deviation is converted into a height difference with which the three rays enter the latter system. This height difference is substantially greater than the height difference with which the ray 50 in the y-z plane enters the correction element 34. This is caused by the fact that the distance between the quadrupole 30 and the correction element 34 is smaller than the distance between the correction elements 34 and 40 and notably by the fact that the quadrupole 30 causes a dispersion which is substantially less than that caused by the correction element 34 which, after all, has been designed for the correction of chromatic aberration and hence causes a strong dispersion. The quadrupole 38 has a slight effect only on the course of these three rays but, because the second correction element 40 in the x-z plane is a strong lens, in this element a large angular difference occurs between the rays of different energy which is due to the large difference in height. From among these rays the ray of nominal energy is oriented parallel to the optical axis again by the quadrupole 44 (acting positively for the x-z plane), whereas the two rays of deviating energy emanate at different angles. As a result of the described process, however, these three rays 52-a, 52-b and 52-c emanate from the correction system at substantially deviating heights, thus implying a large chromatic magnification error. The invention offers a solution to this problem.

FIG. 4 shows the shape of an electrode as it is used in combination with a number of further electrodes so as to form a correction element according to the invention. A correction element thus constructed will be described in detail hereinafter with reference to FIG. 5. The electrode as shown in FIG. 4 consists of four plate-shaped conductors (poles) 60-a, 60-b, 60-c and 60-d which are electrically insulated from one another and are arranged in one flat plane so as to be symmetrically grouped around the optical axis 4 which extends perpendicularly to the plane of drawing in this Figure. This Figure also shows the mutually perpendicular x and y directions. The boundary line of these poles, facing the optical axis, is shaped as a hyperbola which is arranged around an imaginary central circle which is tangent to the hyperbolas. For simplicity of manufacture, the shape of a hyperbola can be approximated in known manner by means of an arc of circle. Each of the poles 60-a to 60-d can be adjusted to a potential $V_1$, $V_2$, $V_3$ and $V_4$, respectively. In the simplest case, $V_1$ and $V_3$ are equal, like $V_2$ and $V_4$ which in that case oppose $V_1$ and $V_3$. However, it is alternatively possible to add one fixed amount to all of said potentials, without the quadrupole effect being lost. This fixed amount may have a different value for a next electrode of the correction element, so that an electrostatic monopole, i.e. an element having a lens effect, is superposed on the quadrupole. The configuration of poles shown in FIG. 4 constitutes only one possibility for realizing the desired quadrupole effect. It is alternatively possible to use a larger number of poles (for example, 12) in known manner, the boundary line facing the optical axis then being short and linear, said linear pieces being symmetrically arranged (with a given clearance) on a circle around the axis. Each of these poles can then be excited in such a manner that a quadrupole field is suitably approximated, but superposed higher-order fields can also be formed thereon. The shape of the quadrupole is not relevant to the idea of the invention in its broadest sense.

Figure 5:
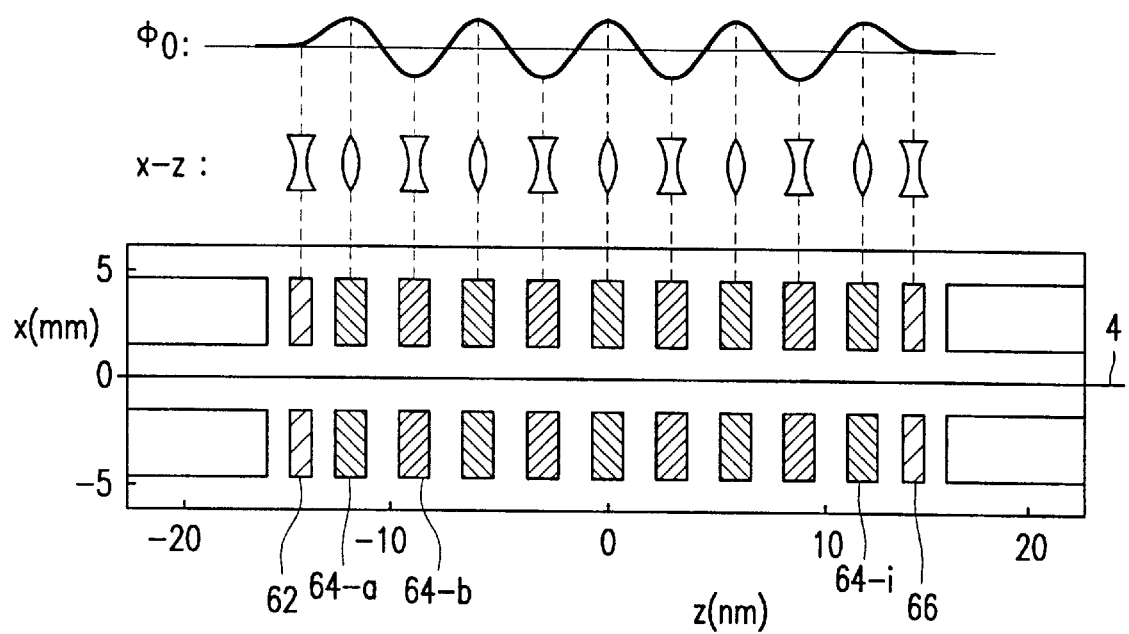
FIG. 5 shows diagrammatically a correction element according to the invention.

FIG. 5 is a diagrammatic side elevation of a correction element according to the invention which is composed of 11 successively arranged electrodes 62, 64-a, 64-b, . . . , 64-i and 66 which may be constructed like the electrode shown in FIG. 4. For the purpose of electric termination a tube carrying a potential 0 V is arranged to the left of the electrode 62 and to the right of the electrode 66. Each of said electrodes is called a layer, said layers together producing the (monopole) potential variation $\Phi_0$ at the optical axis and the (quadrupole) potential variation $\Phi_2$ in the vicinity of the optical axis. The shading of the various layers indicates the sense in which the quadrupole excitation takes place: the layers 62, 64-b, 64-d, 64-f, 64-h and 66 are all excited in the same sense. The layers 64-a, 64-c, 64-e and 64-g are also excited in the same sense which opposes the former sense. This excitation is also represented by the symbols shown above the relevant layers for alternately positive and negative lenses in the x-z plane; those in the y-z plane, of course, oppose the former. FIG. 5 also shows diagrammatically the (monopole) potential variation $\Phi_0$ at the optical axis. Each of the quadrupoles 64-a to 64-i not only has a quadrupole excitation, but also a monopole excitation whereas the two quadrupoles 62 and 66 have a quadrupole excitation only.

Figure 6:
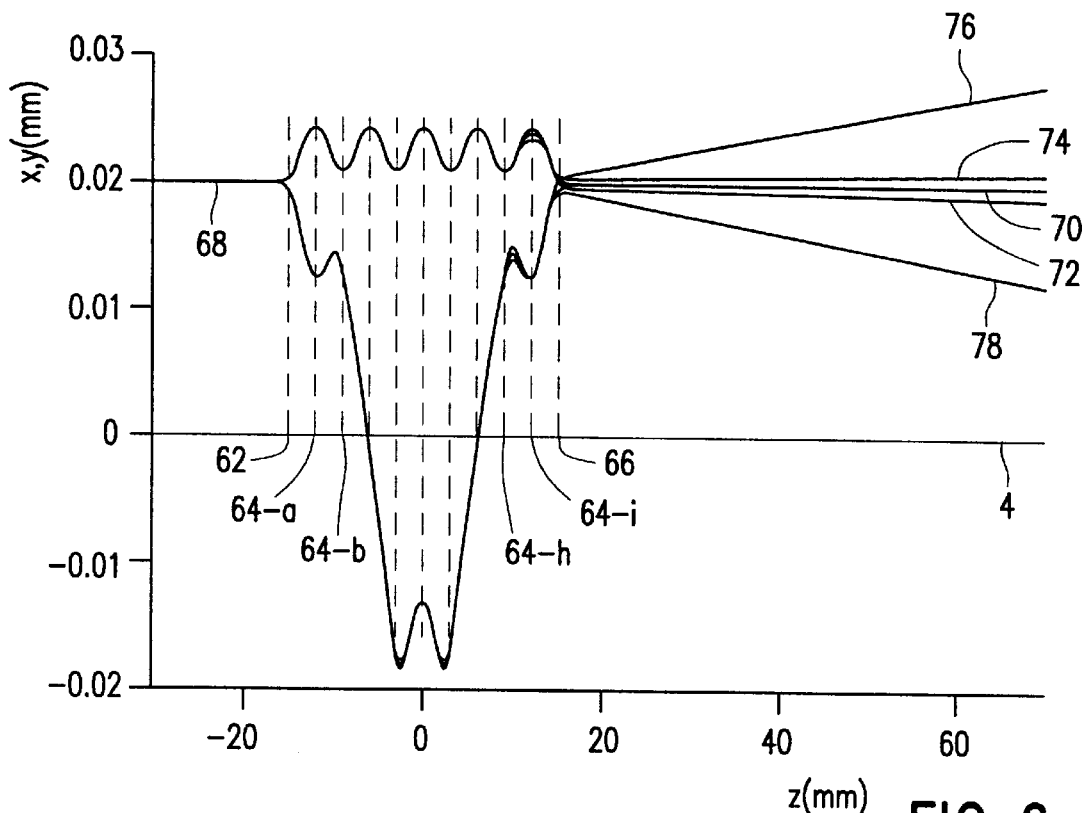
FIG. 6 shows diagrammatically the beam path in a correction element according to the invention, composed of eleven layers of electrodes, both for the x-z plane and for the y-z plane.

The course of the electron rays in the correction element according to FIG. 5 is shown in FIG. 6, both for the x-z plane and for the y-z plane. For the simulation of the course of these rays it is assumed that the acceleration voltage $\Phi_0=1000$ V and that the electrons in the incident electron ray are distributed between three energies, i.e. the nominal voltage of 1000 V and a deviation $\Delta\Phi=\pm 5$ V. In this case the further simulation data were: potential of the layers 62 and 66: 262.8 V in the x-z plane and −262.8 V in the y-z plane; potential of the layers 64-a, 64-c, 64-e, 64-g and 64-i 107.1 V in the x-z plane and 931.9 V in the y-z plane; potential of the layers 64-b, 64-d, 64-f and 64-h: −126.9 V in the x-z plane and −912.1 V in the y-z plane; the radius of the central circle tangent to the hyperbolas amounted to 1.5 mm. The distance between the quadrupoles 62 and 66 and the adjoining tubes for electric termination amounted to 1 mm, like the distance between the quadrupoles 62 and 66 and the adjacent quadrupoles 64-a and 64-i, respectively. The thickness of the quadrupoles 62 and 66 amounted to 1 mm. The thickness of all other quadrupoles 64-a to 64-i amounted to 1.5 mm, like their spacing. FIG. 6 has been obtained by simulation using said simulation program and said dimensions and potentials.

An electron ray 68 is incident, parallel to the optical axis 4, on the first quadrupole 62 of the correction element. In the x-z plane the ray 68 is deflected away from the optical axis by the first quadrupole 62 of the correction element, after which it is deflected back towards the optical axis again by the next quadrupole 64-a. This is repeated a number of times in the quadrupoles 64-b to 64-i, after which, due to the quadrupole 66, the ray 70 emanates parallel to the optical axis from the correction element again. Strictly speaking, the latter holds only for the electrons having the nominal energy of 1000 V; the electrons deviating +5 V or −5 V therefrom follow a path at a slightly deviating angle, i.e. the paths 72 and 74, respectively. This Figure shows that in the x-z plane practically no chromatic magnification error occurs at the exit of the correction element. The correction effect of the correction element shown in FIG. 6 becomes manifest as the comparatively large angular difference between the rays 72 and 74.

In the x-z plane the ray 68 is deflected towards the optical axis by the first quadrupole 62 of the correction element, after which this ray is deflected away from the optical axis again by the next quadrupole 64-a. The subsequent quadrupole 64-b deflects the electron ray towards the optical axis again; this ray intersects said axis at the area of the quadrupole 64-c, after which it is incident on the quadrupole 64-d comparatively far from the axis. The latter quadrupole deflects the ray back in the direction of the axis again, after which it is deflected away from the axis by the quadrupole 64-e and towards the axis again by the quadrupole 64-f; the ray then intersects said axis at the area of the quadrupole 64-g after which it is incident on the quadrupole 64-h comparatively far from the axis, the latter quadrupole deflecting the ray back towards the axis again. The quadrupole 64-i deflects the ray away from the axis again to the quadrupole 66 which finally causes the ray to emanate parallel to the optical axis from the correction element. Strictly speaking, the latter holds only for the electrons having the nominal energy of 1000 V; the electrons deviating +5 V or −5 V therefrom follow a path at a deviating angle, i.e. the paths 76 and 78, respectively. This Figure demonstrates that only a slight chromatic aberration error (which can be ignored for practical purposes) occurs at the exit of the correction element. It appears that in some locations in the y-z plane the extremes of the paths do not coincide exactly with the locations of the optical elements; this can be explained inter alia on the basis of the fact that the various quadrupoles also have a monopole excitation and that the various optical elements are not ideally thin but have a given thickness.

FIG. 6 shows a comparatively large angular difference between the rays 76 and 78, but this difference has hardly any or no effect on the chromatic behavior of the corrector as a whole. There are two causes in this respect. The first cause resides in the fact that the rays are not incident parallel to the optical axis in the complete corrector. The second cause resides in the fact that due to the choice of the length of the correction elements and the quadrupole excitation, the contribution to the corrector strength by the non-corrective surface can be made subordinate to the overall corrector strength. The latter is also demonstrated in the cited article by Archard (section 9). Because of the same cause, this angular deviation is also hardly of importance in respect of the chromatic magnification error. Finally, it is to be noted that the value n=2 (see the expression (44)) holds for the beam path of FIG. 6.

Figure 7:
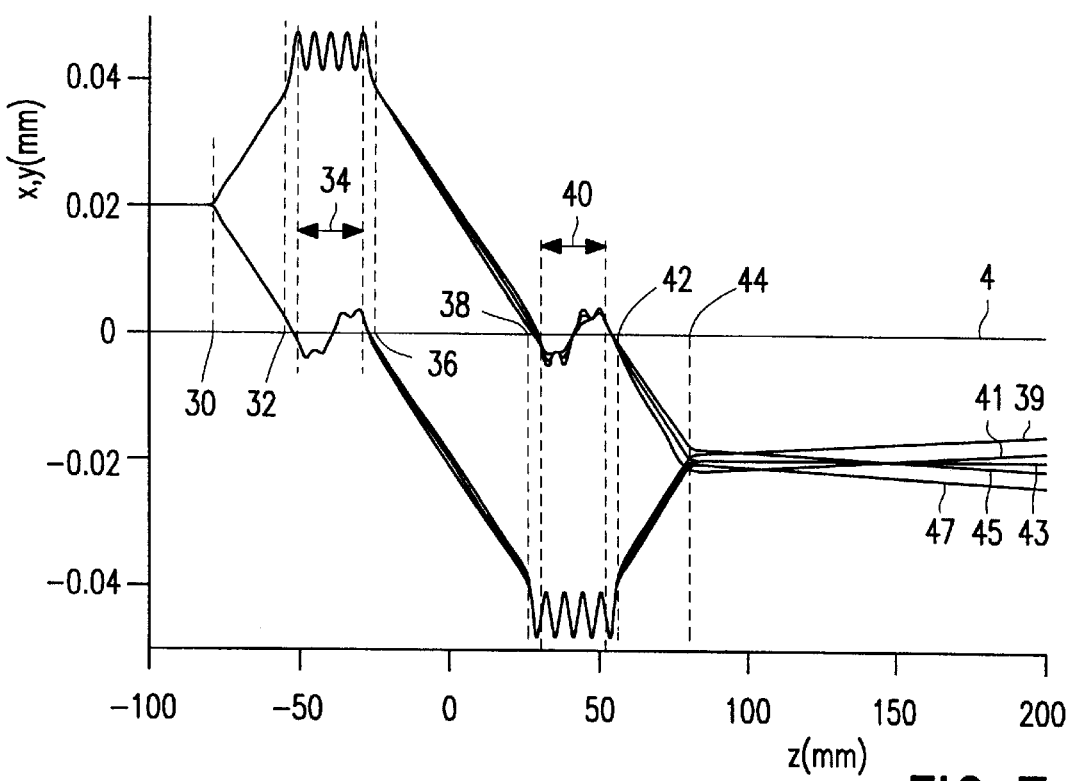
FIG. 7 shows diagrammatically the beam path in a corrector according to the invention in which each correction element is composed of eleven layers of electrodes, both for the x-z plane and for the y-z plane.

FIG. 7 is a diagrammatic representation of the beam path in a corrector according to the invention in which each of the two correction elements is composed of eleven layers, for the x-z plane as well as for the y-z plane, as shown in FIG. 6. The correction elements are assembled with two additional quadrupoles so as to form a corrector as shown in FIG. 2. The additional quadrupoles, therefore, are the quadrupoles 30 and 44. It is to be noted that, as opposed to FIG. 6, in FIG. 7 the electrons are not in all cases incident on the correction element parallel to the optical axis; in two of the four cases they are incident at a given angle because of the presence of the first quadrupole 30 (for the first correction element 34) or because of the traversing of the first correction element 34 (before the second correction element 40). Consequently, the electron paths of FIG. 6 cannot be simply transferred to FIG. 7.

The excitation of the correction elements as used for the simulation of FIG. 7 deviated slightly from that in FIG. 6: the potential of the layers 62 and 66 was 242.9 V in the x-z plane and −242.9 V in the y-z plane; the potential of the layers 64-a, 64-c, 64-e, 64-g and 64-i was 106.8 V in x-z plane and 932.2 V in the y-z plane; the potential of the layers 64-b, 64-d, 64-f and 64-h was −127.2 V in the x-z plane and −911.8 V in the y-z plane. The following data holds for the quadrupoles 30 and 44 as used in the simulation of FIG. 7: each quadrupole consists of an electrode layer according to FIG. 4 which is arranged between two tubes for electric termination. The distance between the electrode layer and the tubes amounts to 1 mm at both sides; the thickness of the electrode layer is 2 mm and the radius of the central circle tangent to the hyperbolas is 1.5 mm, like the inner radius of the tubes. The tubes have a potential of 0 V and the potential of the electrode layer arranged therebetween is +29.7 V for the x-z plane at the quadrupole 30 and −29.7 V for the y-z plane; the opposed values hold for the quadrupole 44.

FIG. 7 shows that the corrector used therein as a whole has direct vision for electrons of nominal energy, i.e. that rays which are incident parallel to the optical axis also emanate parallel to the optical axis again. Evidently, electrons of a deviating energy will emanate from the corrector at a deviating angle, as could be expected for a corrector for chromatic aberration. The rays 39 and 41 emanating from the corrector (directed towards the optical axis) correspond to an energy of 1005 V; the rays 45 and 47 (directed away from the optical axis) correspond to an energy of 995 V and the ray 43 (emanating parallel to the optical axis) corresponds to the nominal energy of 1000 V. The Figure clearly shows the strong dispersion between the systems 32, 34, 36 at the one side and 38, 40, 42 on the other side (for the x-z plane) and between the system 38, 40, 42 on the one side and the quadrupole 44 on the other side (for the y-z plane); this could be expected since the correction elements 34 and 40 have been designed for this purpose. FIG. 7 also shows that the chromatic magnification error (i.e. the difference in height between the rays of deviating energy upon departure from the corrector) is substantially smaller than in the known corrector (compare FIG. 3).

When FIG. 7 is compared with FIG. 3, it appears that the angular difference between the outgoing paths in FIG. 7 is substantially larger than in FIG. 3. This is due notably to the fact that an energy spread of 2 V has been assumed in FIG. 3 and an energy spread of 5 V in FIG. 7.

Figure 8:
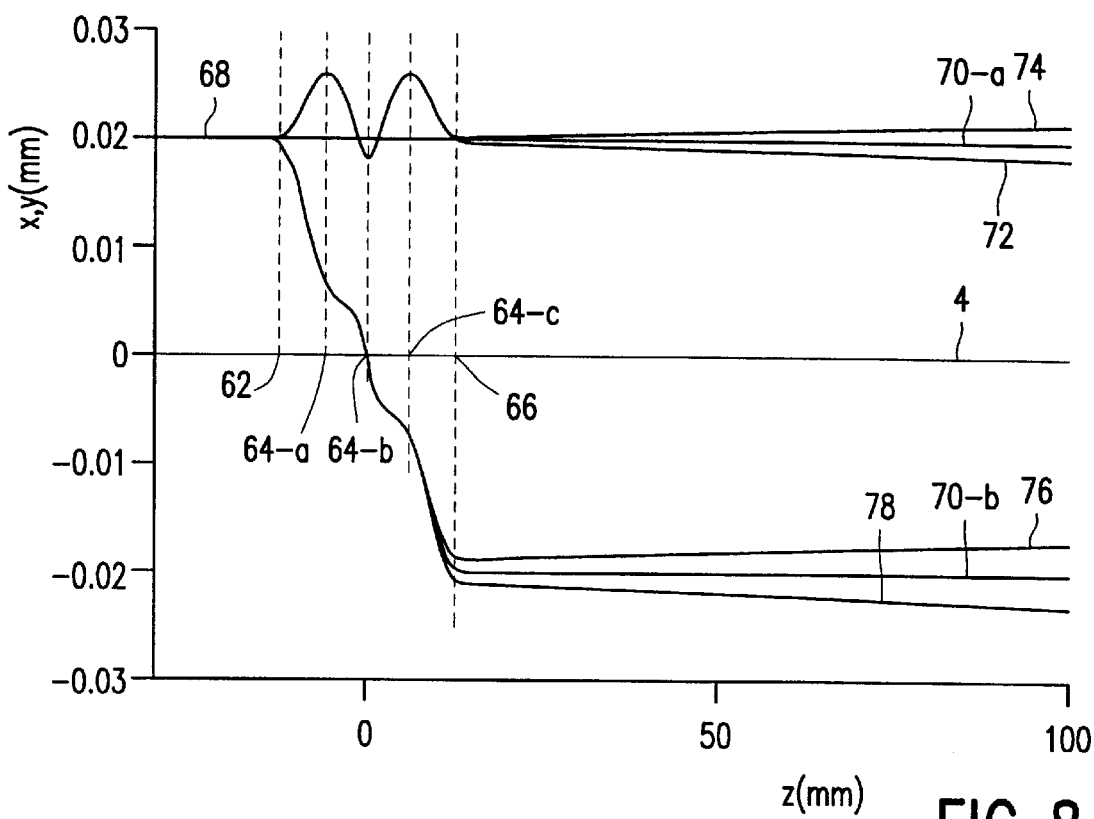
FIG. 8 is a diagrammatic representation of the beam path in a correction element according the invention, composed of five layers of electrodes, both for the x-z plane and for the y-z plane.

FIG. 8 is a diagrammatic representation of the beam path in a correction element according to the invention which, however, is in this case composed of only five layers for the x-z plane as well as for the y-z plane. The construction of such a correction element is not shown in the Figure, but can be readily imagined on the basis of FIG. 5 by assuming the nine layers 64-a to 64-i in this Figure to be replaced by three layers 64-a, 64-b and 64-c, the excitation of the layer 64-b opposing that of the layers 64-a and 64-c whose excitation opposes that of the quadrupoles 62 and 66. These five quadrupoles are enclosed by two tubes for electric termination. Each quadrupole in this correction element is assumed to be constructed as shown in FIG. 4; the radius of the central circle tangent to the hyperbolas amounts to 3 mm, like the inner radius of the tubes for electric termination. The correction element consists of successively a tube which carries a voltage of 0 V and is followed at a distance of 2 mm by the first quadrupole 62 which has a thickness of 2 mm and is followed at a distance of 2 mm by the second quadrupole 64-a which has a thickness of 3 mm and is followed at a distance of 3 mm by the third quadrupole 64-b which has a thickness of 3 mm and is followed at a distance of 3 mm by the fourth quadrupole 64-c which has a thickness of 3 mm and is followed at a distance of 2 mm by the fifth quadrupole 66 which has a thickness of 2 mm and is followed, finally, at a distance of 2 mm by a tube having said inner diameter and a voltage of 0 V. The voltages at the electrodes of the outer two quadrupoles 62 and 66 amount to 513.4 V for the x-z plane and –513.4 V for the y-z plane; the voltages at the electrodes of the two quadrupoles 64-a and 64-c amount to 299 V for the x-z plane and to 2059.6 V for the y-z plane, and at the central quadrupole 64-b the voltages amount to –361.4 V for the x-z plane and –1997.2 V for the y-z plane.

For the simulation of the course of the electron rays as shown in FIG. 8 it has been assumed that the acceleration voltage $\Phi_0=1000$ V and that the electrons in the incident electron ray are distributed between three energies, i.e. the nominal voltage of 1000 V and a deviation $\Delta\Phi=\pm 5$ V. FIG. 8 has been obtained by simulation while using the previously mentioned simulation program and the stated dimensions and potentials.

In FIG. 8 an electron ray 68 is incident on the first quadrupole 62 of the correction element, parallel to the optical axis 4. In the x-z plane the ray 68 is deflected away from the optical axis by the first quadrupole 62 of the correction element, after which it is deflected back towards the optical axis again by the next quadrupole 64-a. Subsequently, the quadrupole 64-b deflects the ray away from the optical axis again, after which it is deflected back towards the optical axis by the next quadrupole 64-c. The ray 70 subsequently traverses the last quadrupole 66 and emanates from the correction element parallel to the optical axis again. Strictly speaking, the latter is the case only for the electrons having the nominal energy of 1000 V; the electrons having an energy which deviates +5 V or –5 V therefrom follow a path at a slightly different angle, being the paths 72 and 74, respectively. This Figure shows that again practically no chromatic magnification error occurs in the x-z plane at the exit of the correction element consisting of five layers. The corrective effect for the chromatic aberration becomes manifest as the comparatively large angular difference between the rays 72 and 74.

In the y-z plane the ray 68 is deflected towards the optical axis by the first quadrupole 62 of the correction element, after which it is deflected slightly back again by the next quadrupole 64-a, but still continues to travel in the direction of the optical axis. The subsequent quadrupole 64-b deflects the electron beam more steeply to the optical axis again; the ray intersects said axis at the area of the quadrupole 64-b and is subsequently incident on the quadrupole 64-c comparatively far from the axis. The latter quadrupole makes the ray extend slightly steeper again, after which the ray is deflected by the last quadrupole 66 so that it ultimately emanates from the correction element parallel to the optical axis. Strictly speaking, the latter holds only for the electrons having the nominal energy of 1000 V. The electrons having an energy deviating +5 V or –5 V therefrom follow a path at a deviating angle, i.e. the paths 76 and 78, respectively. FIG. 8 shows that a slight chromatic magnification error (which can be ignored for practical purposes) occurs in the y-z plane at the exit of the correction element.

It is to be noted that when the expression (44) is applied to FIG. 8, the value n=1 is used. This means that a ray incident at the height 1 and parallel to the optical axis emanates at the height –1 and parallel to the optical axis. Generally speaking, the determinant of a transfer matrix equals 1, so that this transfer matrix has the same property as a drift space matrix. This demonstrates that, even though the dispersion may be great, there is no mechanism which could cause the chromatic magnification error to become inadmissibly large.

Figure 9:
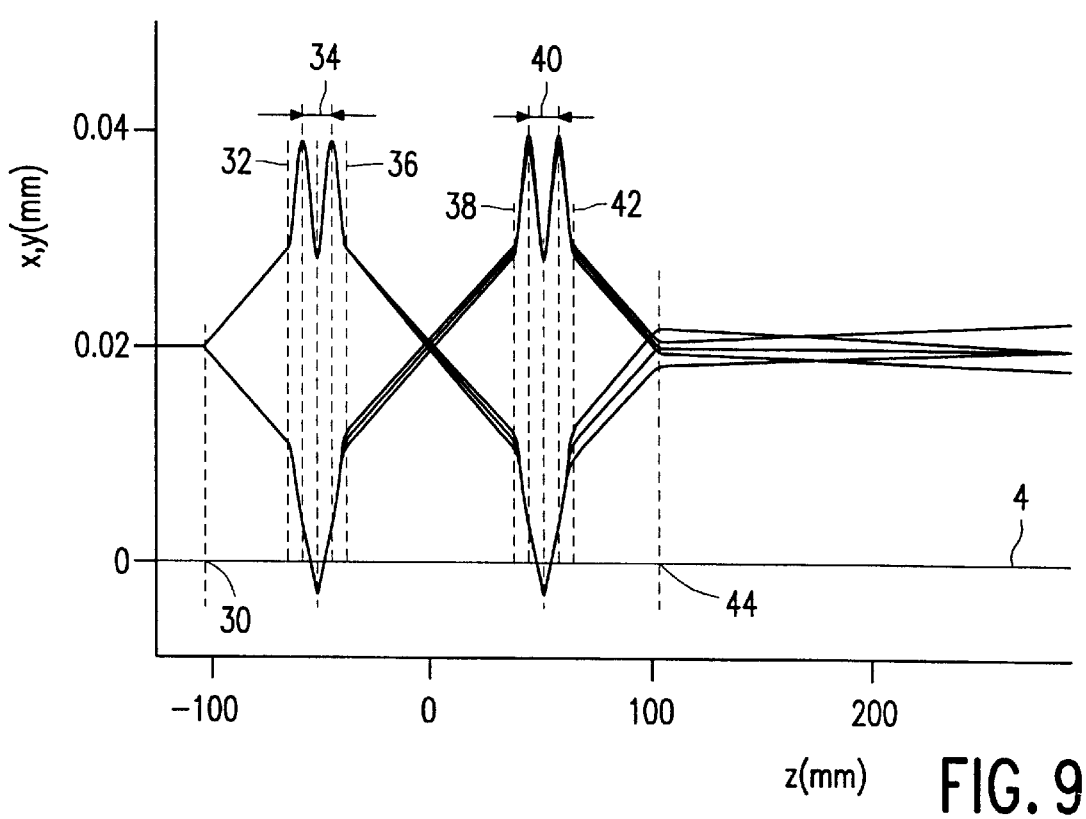
FIG. 9 is a diagrammatic representation of the beam path in a corrector according to the invention in which each correction element is composed of five layers of electrodes, both for the x-z plane and for the y-z plane.

FIG. 9 is a diagrammatic representation of the beam path in a corrector according to the invention in which each of the two correction elements is composed of five layers, both for the x-z plane and for the y-z plane, the beam path for said elements is shown in FIG. 8. The correction elements are assembled with two additional quadrupoles so as to form a corrector as shown in FIG. 2. Thus, the additional quadrupoles are the quadrupoles 30 and 44. In the corrector used for the simulation shown in FIG. 9, the quadrupoles 32 and 36 are integrated in the correction element 34 and the quadrupoles 38 and 42 are integrated in the correction element 40; this does not make an essential difference in respect of the behavior of the corrector. It is to be noted that, as opposed to FIG. 7, the electrons in FIG. 9 are not incident parallel to the optical axis on the correction elements, but at a given angle which deviates from zero; for the first correction element 34 this is due to the presence of the first quadrupole 30 and for the second correction element 40 it is due to the fact that the first correction element has first been traversed. Consequently, the electron paths of FIG. 8 cannot be simply transferred to FIG. 9.

For the simulation of the course of the electron rays in FIG. 9 it has been assumed that the acceleration voltage $\Phi_0=1000$ V and that the electrons in the incident electron ray are distributed between three energies, i.e. the nominal voltage of 1000 V and a deviation $\Delta\Phi=\pm 2$ V. The correction elements 32, 34, 36 and 38, 40, 42 were composed as described with reference to FIG. 8, be it that different voltages were present at the electrodes. The voltages at the electrodes of the outer two quadrupoles 62 and 66 are 508.0 V for the x-z plane and –508.0 V for the y-z plane; at the electrodes of the two quadrupoles 64-a and 64-c they amount to 293.6 V for the x-z plane and 2065.0 V for the y-z plane, and for the central quadrupole 64-b they amount to –366.8 V for the x-z plane and –1991.8 V for the y-z plane. The following data holds for the additional quadrupoles 30 and 44 in FIG. 9: each quadrupole consists of an electrode layer according to FIG. 4 which is arranged between two tubes for electric termination. The distance between the electrode layer and the tubes amounts to 1 mm at both sides; the thickness of the electrode layer is 2 mm and the radius of the central circle tangent to the hyperbolas amounts to 1.2 mm, like the inner radius of the tubes. The tubes carry a potential of 0 V and the electrode layer arranged therebetween at the quadrupole 30 has a voltage of +6.49 V for the x-z plane and −6.49 V for the y-z plane; opposite values hold for the quadrupole 44. FIG. 9 has been obtained by simulation using the previously mentioned simulation program and the stated dimensions and potentials.

FIG. 9 shows that the corrector used therein as a whole has direct vision for electrons of nominal energy. Evidently, electrons having an energy which deviates from the nominal value emanate from the corrector at a deviating angle, as could be expected for a corrector for chromatic aberration. The Figure also shows that the chromatic magnification error is significantly smaller than in the known corrector (compare FIG. 3). Therefore, on the basis of the FIGS. 8 and 9 it can be deduced that a satisfactorily operating corrector for chromatic aberration can be composed by using not more than five layers.

Figure 10:
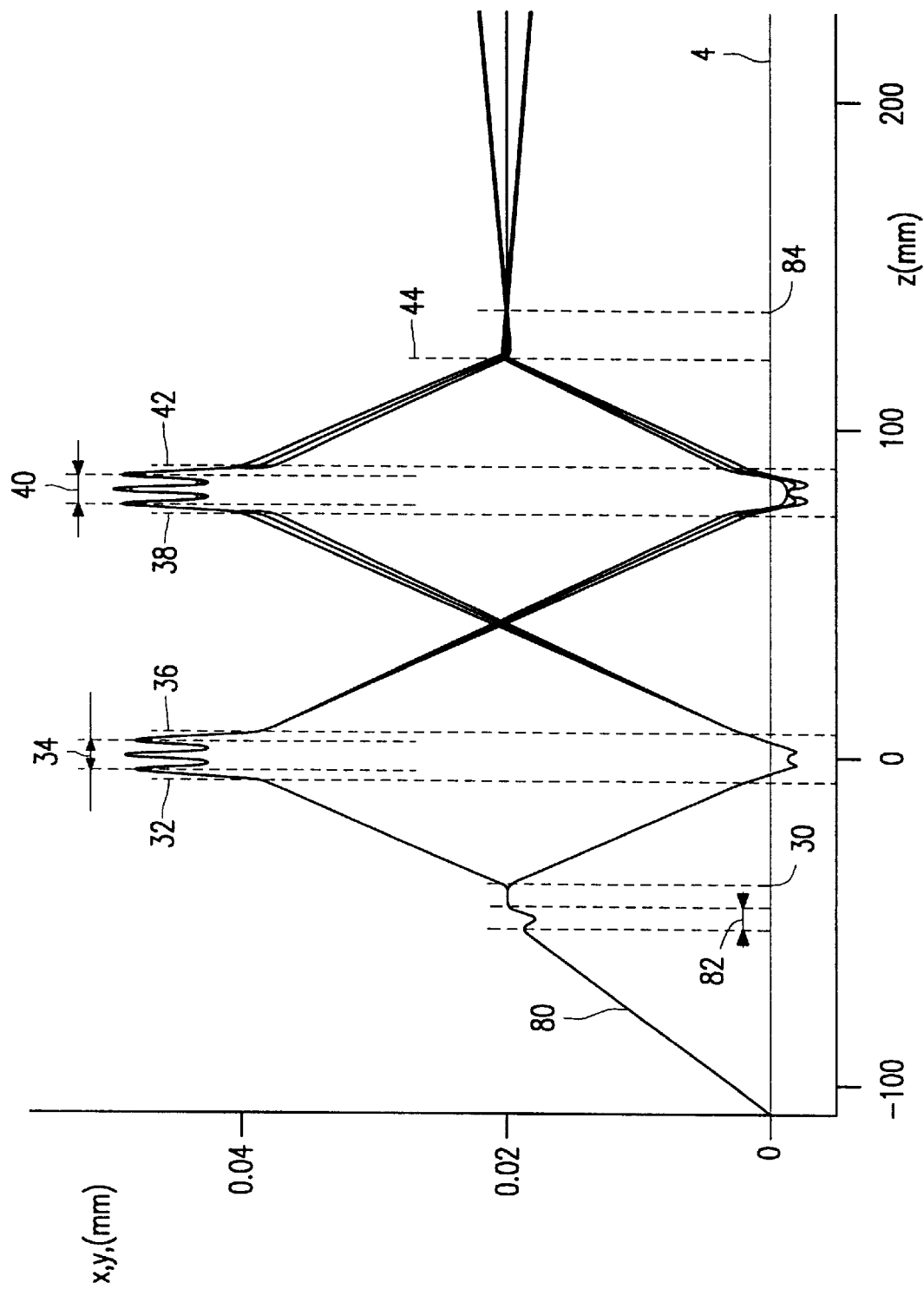
FIG. 10 is a diagrammatic representation of the beam path in a corrector according to the invention in which the correction elements are excited in such a manner that the chromatic magnification error is exactly zero.

FIG. 10 is a diagrammatic representation of the beam path in a corrector according to the invention in which the correction elements are excited in such a manner that the chromatic magnification error is exactly zero. Each of the correction elements of this corrector is composed of seven layers, both for the x-z plane and for the y-z plane. The construction of such a correction element is not shown in a Figure, but can be readily imagined on the basis of FIG. 5 by assuming the nine layers 64-*a* to 64-*i* therein to be replaced by five layers 64-*a*, 64-*b*, 64-*c*, 64-*d* and 64-*e*, the excitation of the layers 64-*b* and 64-*d* being opposed to that of the layers 64-*a*, 64-*c* and 64-*e*, the excitation of the latter three layers being opposed again to that of the quadrupoles 62 and 66.

The dimensions and the voltages of the electrodes of the correction elements were different for the two correction elements in FIG. 10. The following dimensions and voltages hold for the first correction element 32, 34, 36. The seven quadrupoles of the correction element are enclosed by two tubes for electric termination. Each quadrupole in this correction element is assumed to be constructed as shown in FIG. 4; the radius of the central circle tangent to the hyperbolas is then 1.2 mm, like the inner radius of the tubes for electric termination. The correction element consists successively of a tube which has a voltage of 0 V and is succeeded at a distance of 0.8 mm by the first quadrupole 62 which has a thickness of 0.8 mm and is succeeded at a distance of 0.8 mm by the second quadrupole 64-*a* which has a thickness of 1.2 mm and is succeeded at a distance of 1.2 mm by the third quadrupole 64-*b* which has a thickness of 1.2 mm and is succeeded at a distance of 1.2 mm by the fourth quadrupole 64-*c* which has a thickness of 1.2 mm. The other dimensions are known, because the correction element is mirror symmetrical relative to a plane through the center of the electrode 64-*c*. The voltages at the electrodes of the outer two quadrupoles 62 and 66 are 280.8 V for the x-z plane and −280.8 V for the y-z plane; at the electrodes of the three quadrupoles 64-*a*, 64-*c* and 64-*e* they amount to 107.2 V for the x-z plane and 1004.0 V for the y-z plane; at the electrodes of the two quadrupoles 64-*b* and 64-*d* they amount to −133.6 V for the x-z plane and to −977.6 v for the y-z plane.

The following dimensions and voltages hold for the second correction element 38, 40, 42. The composition of the second correction element is the same as that of the first correction element. In order to obtain the dimensions for the second correction element, all dimensions of the first correction element must be multiplied by a factor 0.82. The first and the last tube again carry a voltage of 0 V. The voltages at the electrodes of the outer two quadrupoles 62 and 66 amount to −256.3 V for the x-z plane and 256.3 V for the y-z plane; at the electrodes of the three quadrupoles 64-*a*, 64-*c* and 64-*e* they amount to 912.1 V for the x-z plane and 98.5 V for the y-z plane; at the electrodes of the two quadrupoles 64-*b* and 64-*d* they amount to −890.1 V for the x-z plane and −120.5 V for the y-z plane.

The electrodes of the two quadrupoles 30 and 44 have a central circle tangent to the hyperbolas which has a radius of 1.2 mm. The two quadrupoles consist successively of a tube for electric termination which has an inner diameter of 1.2 mm and is succeeded at a distance of 1 mm by a quadrupole which has a thickness of 2 mm and is succeeded at a distance of 1 mm by a tube for electric termination which has an inner diameter of 1.2 mm. The voltages at the electrodes of the quadrupole 30 are +14.8 V and −14.8 V for the x-z plane and the y-z plane, respectively, and the opposite values hold for the quadrupole 44. For the simulation of the course of the electron rays it was assumed that the acceleration voltage $\Phi_0$=1000 V and that the electrons in the incident electron ray were distributed between three energies, i.e. the nominal voltage of 1000 V and a deviation $\Delta\Phi$=±5 V. FIG. 10 has been obtained by simulation while using said simulation program and the stated dimensions and potentials.

In FIG. 10 a ray 80 extends from a point on the axis 4 through a round lens first; the position of this round lens is denoted by the reference numeral 82 on the axis. Under the influence of this round lens the ray 80 is directed parallel to the axis, after which it is split by the quadrupole 30 so as to form a ray for the x-z plane and a ray for the y-z plane. The course of the rays in the x-z plane and in the y-z plane is again substantially the same as described with reference to the FIGS. 6, 7, 8 and 9 and need not be elaborated again. The difference between the beam path in FIG. 10 and that in said other Figures consists in that in FIG. 10 the ray does not follow a path forming an integer number of half sine periods; the quadrupoles are now excited in such a manner that the shape of the path deviates slightly therefrom in each of the correction elements. Because of this deviation, two degrees of freedom are obtained (one for each correction element): these degrees of freedom can be used to make the point with a chromatic magnification error equal to zero for the x-z plane coincide with the corresponding point for the y-z plane and, moreover, to move these coincident points to a desired position on the optical axis. This position is denoted by the reference numeral 84 in FIG. 10. A round lens to be corrected for chromatic aberration can be arranged at that point, resulting in an achromatic system which also has a chromatic magnification error equal to zero.

What is claimed is:
1. A particle-optical apparatus which includes:
   a particle source for emitting a beam of electrically charged particles which travel along an optical axis of the apparatus in order to expose an object, to be irradiated in the apparatus, by means of the particle beam,
   a focusing lens for focusing the beam of electrically charged particles,
   and a corrector for correcting the chromatic aberration of the focusing lens,
      which corrector includes correction elements, each of which is provided with electrodes for producing electric quadrupole fields, said electrodes being arranged in successive layers along the optical axis, the quadrupole fields produced by the electrodes in the layers being rotated through an angle of substantially 90° about the optical axis relative to the quadrupole field produced by the electrodes in an adjacent layer, characterized in that the correction elements comprise at least five layers of quadrupole electrodes.

2. A corrector for correcting the chromatic aberration of a charred particle beam system comprising:

correction elements, each of which is provided with electrodes for producing electric quadrupole fields, said electrodes being arranged in successive layers along the optical axis, the quadrupole fields produced by the electrodes in the layers being rotated through an angle of substantially 90° about the optical axis relative to the quadrupole field produced by the electrodes in an adjacent layer, the correction elements including at least five layers of quadrupole electrodes.

3. A method of operating a corrector for correcting the chromatic aberration of a focusing lens of a particle optical apparatus comprising:

providing a corrector includes correction elements, each of which is provided with electrodes for producing electric quadrupole fields, said electrodes being arranged in successive layers along with optical axis, the quadrupole fields produced by the electrodes in the layers being rotated through an angle of substantially 90° about the optical axis of the apparatus relative to the quadrupole field produced by the electrodes in an adjacent layer; and producing the quadrupole fields in such a manner that a point of a first correction element of the corrector with a chromatic magnification error equal to zero is coincident with a corresponding point of a second correction element of the corrector.

* * * * *